United States Patent
Bakowski Holtryd et al.

(10) Patent No.: US 11,888,015 B2
(45) Date of Patent: Jan. 30, 2024

(54) X-RAY SENSOR HAVING A FIELD LIMITING RING CONFIGURATION

(71) Applicant: PRISMATIC SENSORS AB, Stockholm (SE)

(72) Inventors: Mietek Bakowski Holtryd, Stillingsön (SE); Mats Danielsson, Täby (SE); Cheng Xu, Täby (SE)

(73) Assignee: Prismatic Sensors AB, Stockholm (SE)

( * ) Notice: Subject to any disclaimer, the term of this patent is extended or adjusted under 35 U.S.C. 154(b) by 137 days.

(21) Appl. No.: 17/610,383

(22) PCT Filed: May 14, 2019

(86) PCT No.: PCT/SE2019/050430
§ 371 (c)(1),
(2) Date: Nov. 10, 2021

(87) PCT Pub. No.: WO2020/231304
PCT Pub. Date: Nov. 19, 2020

(65) Prior Publication Data
US 2022/0262844 A1    Aug. 18, 2022

(51) Int. Cl.
*H01L 27/146* (2006.01)
*G01T 1/24* (2006.01)

(52) U.S. Cl.
CPC ........ *H01L 27/14658* (2013.01); *G01T 1/241* (2013.01); *H01L 27/14601* (2013.01);
(Continued)

(58) Field of Classification Search
CPC .............. G01N 2223/504; G01T 1/241; H01L 27/14601; H01L 27/14603; H01L 27/14658; H01L 27/14683
See application file for complete search history.

(56) References Cited

U.S. PATENT DOCUMENTS

| 4,377,816 A | 3/1983 | Sittig |
| 6,380,528 B1 * | 4/2002 | Pyyhtia ................. H04N 25/53 |
| | | 348/E3.019 |

(Continued)

FOREIGN PATENT DOCUMENTS

| CN | 105489639 | 4/2016 |
| EP | 0 588 320 | 3/1994 |

(Continued)

OTHER PUBLICATIONS

X. Deng, et al., "A Near Ideal Edge Termination Technique for Ultrahigh-Voltage 4H-SiC Devices with Multi-Zone Gradient Field Limiting Ring", Conference proceedings from 2018 1st Workshop on Wide Bandgap Power Devices and Applications in Asia (WiPDA Asia), pp. 144-148.

(Continued)

*Primary Examiner* — Mark R Gaworecki

(57) ABSTRACT

Disclosed is an X-ray sensor having an active detector region including detector diodes on its surface. The X-ray sensor further includes a junction termination surrounding the surface region including the detector diodes. The junction termination includes a guard arranged closest to the end of the surface region, a field stop outside the guard and at least two field limiting rings, FLRs arranged between the guard and the field stop. A first FLR is arranged at a distance $\Delta_1$ from the guard selected from the interval [4 µm; 12 µm], a second FLR is arranged at a distance $\Delta_2$ from the first FLR selected from the interval [6.5 µm; 14 µm], and wherein the distance $\Delta_2$ is larger than the distance $\Delta_1$. The proposed technology also provides a method for constructing such an X-ray sensor and an X-ray imaging system including an X-ray detector system that includes such X-ray sensor.

20 Claims, 19 Drawing Sheets

(52) U.S. Cl.
CPC .. *H01L 27/14683* (2013.01); *G01N 2223/504* (2013.01); *H01L 27/14603* (2013.01)

(56) References Cited

U.S. PATENT DOCUMENTS

| | | |
|---|---|---|
| 8,093,624 B1 | 1/2012 | Renzi et al. |
| 10,074,685 B1 | 9/2018 | Bakowski Holtryd |

FOREIGN PATENT DOCUMENTS

| | | |
|---|---|---|
| EP | 0 661 753 | 7/1995 |
| EP | 3814806 B1 | 1/2023 |
| KR | 10-1220506 | 1/2013 |

OTHER PUBLICATIONS

K. Ranjan, et al., "Impact of metal overhang and guard ring techniques on breakdown voltage of Si strip sensors", Conference proceedings from 2003 IEEE Nuclear Science Symposium and Medical Imaging Conference, vol. 2, pp. 780-783.

T. Wing-Shan, et al., "Design and analysis of 600 V power MOSFET with multiple field limiting ring", Conference Proceedings from IEEE International Conference on Electron Devices and Solid-State Circuits 2008, pp. 1-4.

B. F. Phlips, et al., "Development of Thick Intrinsic Silicon Detectors for Hard X-ray and Gamma-ray Detection," 2001 EEE Nuclear Science Symposium Conference Record (Cat. No. 01CH37310), USA, IEEE, Aug. 7, 2002, pp. 207-211.

EP patent application 19928793.9 filed Dec. 6, 2021—European Search Report dated Nov. 21, 2022, 6 pages.

JP patent application 2021-567898 filed Nov. 11, 2021—Office Action dated Nov. 4, 2022, 4 pages; Machine Translation.

Kyung-Wook Shin, et al., "Optimizing floating guard ring designs for FASPAX N-in-P silicon sensors," arXiv, USA, Cornell University, Sep. 13, 2016, arXiv:1609.04044v1, pp. 1-8 (well-known technique).

R. Bradford, N-In-N Sensor Geometry, slideplayer.com, Feb. 3, 2016, https://slideplayer.com/slide/10548127/.

Vijay Mishra et al., "Role of guard rings in improving the performance of silicon detectors," Indian Academy of Sciences, Germany, Springer, Aug. 1, 2005, vol. 65, No. 2, pp. 259-272.

X. Deng, et al., "A Near Ideal Edge Termination Technique for Ultrahigh-Voltage 4H-SiC Devices with Multi-Zone Gradient Field Limiting Ring", Conference proceedings from 2018 1st Workshop on Wide Bandgap Power Devices and Applications in Asia (WiPDA Asia), pp. 144-148. [submission pending].

K. Ranjan, et al., "Impact of metal overhang and guard ring techniques on breakdown voltage of Si strip sensors", Conference proceedings from 2003 IEEE Nuclear Science Symposium and Medical Imaging Conference, vol. 2, pp. 780-783. [submission pending].

T. Wing-Shan, et al., "Design and analysis of 600 V power MOSFET with multiple field limiting ring", Conference Proceedings from IEEE International Conference on Electron Devices and Solid-State Circuits 2008, pp. 1-4. [submission pending].

International Search Report for PCT/SE2019/050430 dated Jan. 29, 2020, 5 pages.

Written Opinion of the ISA for PCT/SE2019/050430 dated Jan. 29, 2020, 5 pages.

* cited by examiner

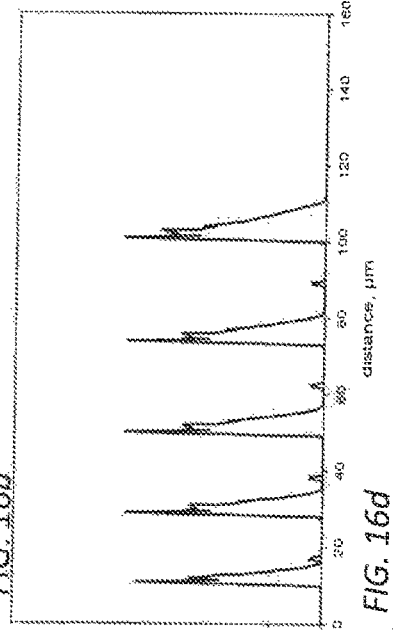
FIG. 16b
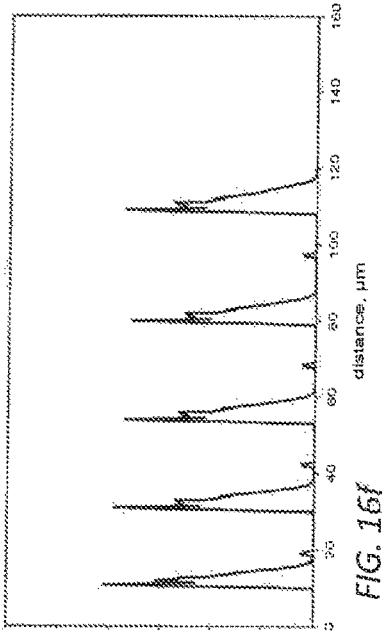
FIG. 16d
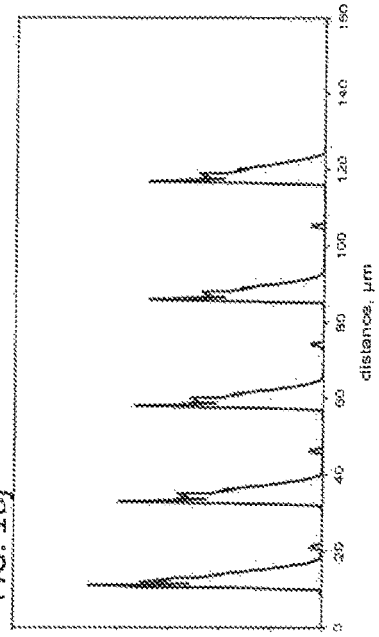
FIG. 16f
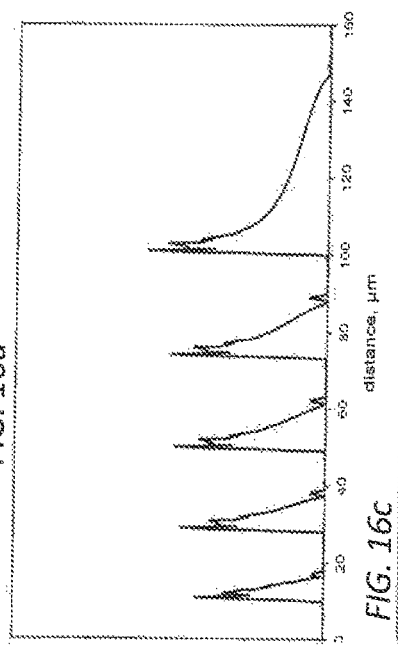
FIG. 16a
FIG. 16c
FIG. 16e

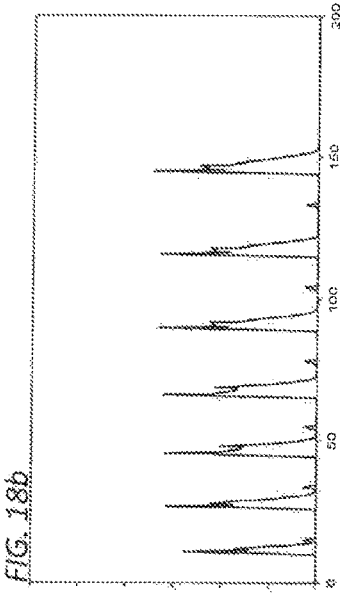
FIG. 18a
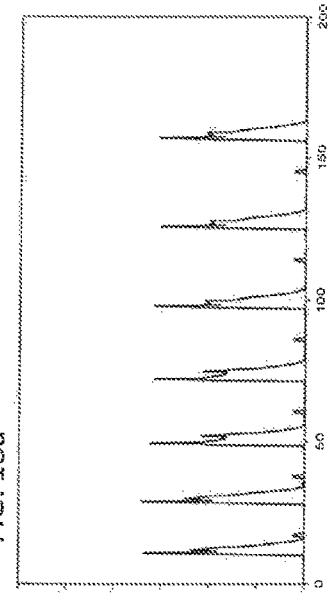
FIG. 18b
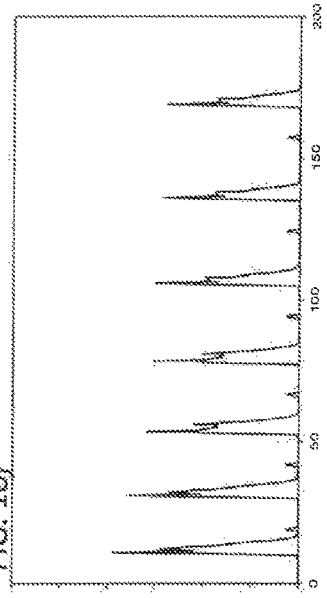
FIG. 18c
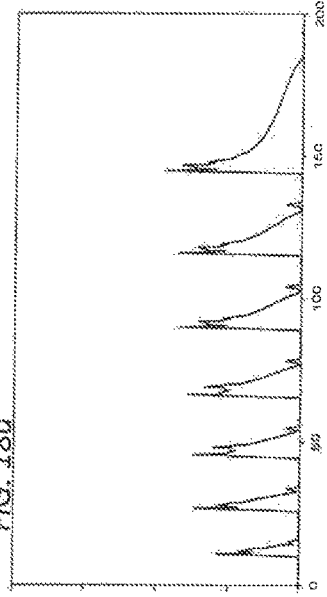
FIG. 18d
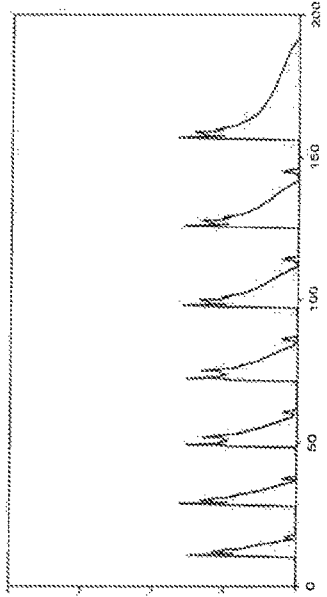
FIG. 18e
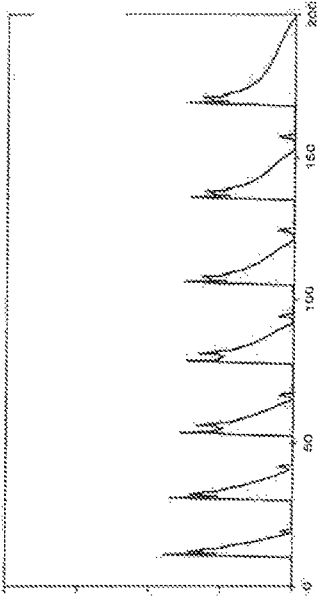
FIG. 18f
FIG. 18

# X-RAY SENSOR HAVING A FIELD LIMITING RING CONFIGURATION

This application is the U.S. national phase of International Application No. PCT/SE2019/050430 filed May 14, 2019 which designated the U.S., the entire contents of which are hereby incorporated by reference.

The project leading to this application has received funding from the European Union's Horizon 2020 research and innovation program under grant agreement No 830294.

TECHNICAL FIELD

The proposed technology generally relates to X-ray applications such as X-ray imaging, and more particularly to an X-ray sensor, also referred to as an X-ray detector. The proposed technology also relates to a method for constructing an X-ray sensor and an X-ray imaging system having a detector system that comprises such an X-ray sensor.

BACKGROUND

Radiographic imaging such as X-ray imaging has been used for years in medical applications and for non-destructive testing.

Normally, an X-ray imaging system includes an X-ray source and an X-ray detector system. The X-ray source emits X-rays, which pass through a subject or object to be imaged and are then registered by the X-ray detector system. Since some materials absorb a larger fraction of the X-rays than others, an image is formed of the subject or object. The X-ray detector may be of different types, including energy-integrating detectors and photon-counting detectors.

A traditional X-ray detector design normally includes, on the top side, an active detector area covered by detector diodes pixels, e.g. in the form of strips or rectangular or hexagonal areas p-type doped in the case the substrate is an n-type high resistivity material. The top side also includes a so-called junction termination area including a so-called guard.

For maximum sensitivity the highly resistive n-type part of the detector that builds a so called drift region of the PiN diode structure must be totally depleted of charge. This requires applying a voltage of at least 300 Volts for a 500-550 µm thick n-type region without reaching a condition of junction breakdown at the position of the maximum electric field in the structure. Furthermore, the detector must sustain significantly higher voltage to secure tolerance to the positive surface charge which is created as a result of irradiation in the passivating oxide. This is known to increase the electric field at the surface and reduce the breakdown voltage. The function of the junction termination is to spread the electric field along the surface of the detector in order to reduce the electric field strength and to secure the tolerance to the positive oxide charge and long enough lifetime of the detector under irradiation.

There are two main concepts of the junction termination that are applied to PiN diodes and detectors. One is Multiple Floating Field Rings MFFR and the second is so called Junction Termination Extension JTE. The MFFR uses the principle of dividing the applied reverse voltage into small fractions contained in the spaces between floating rings surrounding the anode p+ pixels covered area and the JTE uses the principle of charge neutrality between the dopant charge in the JTE under depletion negatively charged acceptors and in the n-type drift region also under depletion positively charged donors. A characteristic of both techniques is that they use a large area. The very principle of the field reduction is to widen the depletion region width at the surface as compared to that in the bulk of the material. For the required voltages of 300V to 800V the width of the junction termination is between 100 µm and 500 µm including the guard. The floating rings are normally equipped with metal plates helping to avoid the potential crowding at the edges of the pixel diodes.

The guard is the outermost electrode contacting the outermost p-type doped ring with a function to collect the leakage current from the areas outside of the detector and towards the detector edge. This electrode is normally connected to the ground.

A particular drawback of the termination is the loss of the active detector area. Also, since many detectors are combined to cover larger area the lost area in each individual detector constitutes "dead" or blind areas in the detector matrix which has a negative influence on the quality of the obtained image.

U.S. Pat. No. 4,377,816 relates to a semiconductor element having at least one p-n junction and provided with zone guard rings for improving the suppression behavior of the p-n junction. The zone guard ring substantially acts as a so called channel stopper field stop to prevent the space charge region electric field from reaching the edge of the device and thus prevent leakage of current. This represents a simple planar diode without any junction termination and with the only protection of preventing the electric filed from reaching the side wall surface of the device.

U.S. Pat. No. 8,093,624 relates to an avalanche photodiode having a device structure that enables a fill-factor approaching 100% at visible and near-infrared wavelengths, eliminating the need for optical focusing techniques. There is provided an n-type active region and a p-type active region. A first one of the n-type and p-type active regions is disposed in a semiconductor substrate at a first substrate surface. A second one of the n-type and p-type active regions includes a high-field zone disposed beneath the first one of the active regions at a first depth in the substrate, a mid-field zone disposed laterally outward of the first active region at a second depth in the substrate greater than the first depth, and a step zone connecting the high-field zone and the mid-field zone in the substrate. With this configuration, the photodiode structure prevents non-avalanche photoelectron collection by substantially inhibiting photoelectron paths that circumvent the high-field avalanche region of the device. Conventional channel stop regions, provided as p+ regions, are located at the edges of the photodiode. The photodiode may also include a conventional guard ring structure at the periphery of the cathode, laterally surrounding the photodiode cathode, e.g., in a circular configuration. The avalanche photodiode operates at avalanche condition breakdown at low voltage, and the issue of terminating the entire array of pixel diodes is not addressed. U.S. Pat. No. 8,093,624 rather concerns the design and configuration of individual photodiodes, where channel stoppers are used to separate individual pixel diodes.

EP 0661753 A1 relates to an improved edge termination scheme for semiconductor structures including field-limiting rings having a fine-to-coarse incrementing scheme which is spatially additive assuring constancy against lateral junction variation. This spatially increasing scheme greatly enhances breakdown voltage characteristics. Additionally, redundant rings are used to further guarantee insensitivity of the device to manufacturing variations.

Despite all the efforts invested in the design of detectors there is still room for improvement. The proposed technology aims to provide an X-ray detector with improved junction termination, in particular a junction termination that utilizes Field Limiting Rings, FLRs.

SUMMARY

It is an object to provide an X-ray detector with improved junction termination, in particular a junction termination that utilizes field limiting rings.

It is a particular object to provide an X-ray detector having a particular configuration of Field Limiting Rings, FLRs which ensures a well-balanced and even spread of electric field peaks along various FLRs.

It is another object to provide X-ray detector having a particular configuration of Field Limiting Rings which ensures a well-balanced and even spread of electric field peaks along various FLRs for X-ray detectors that utilizes a small number of FLRs, e.g., the number N of FLRs used are $\leq 2$ N$\leq 6$.

It is still another object of the proposed technology to provide a method for constructing an X-ray detector having an improved junction termination, in particular a junction termination that utilizes field limiting rings.

It is a particular object to provide an X-ray detector having a particular configuration of Field Limiting Rings, FLRs which ensures a well-balanced and even spread of electric field peaks along various FLRs in a wide range of surface charge concentrations e.g. $10^{10}$ to minimum $5 \times 10^{11}$ charges per cm$^2$ providing tolerance of breakdown voltage and leakage current to X-ray exposure under long time and securing long detector life.

These and other objects are met by embodiments of the proposed technology.

According to a first aspect, there is provided an X-ray sensor having an active detector region comprising a plurality of detector diodes arranged on a surface region 3 of the X-ray sensor. The X-ray sensor further comprising a junction termination surrounding the surface region comprising the plurality of detector diodes. The junction termination comprises a guard that is arranged closest to the end of the surface region, a field stop arranged outside the guard, and at least two field limiting rings, FLRs, that are arranged between the guard and the field stop. A first FLR is arranged at a distance $\Delta_1$ from the guard selected from the interval [4 µm; 12 µm] and a second FLR is arranged at a distance $\Delta_2$ from the first FLR selected from the interval [6.5 µm; 15 µm], the distances are selected so that the distance $\Delta_2$ is larger than the distance $\Delta_1$.

According to a second object there is provided an X-ray imaging system comprising an X-ray source configured to emit X-rays. The X-ray imaging system also comprises an X-ray detector system comprising at least one X-ray detector according to the first object and an image processing device.

According to a third object there is provided a method for constructing an X-ray sensor. The method comprises the step of providing a plurality of detector diodes on a surface region of a material substrate. The method also comprises the step of providing the material substrate with a junction termination surrounding the surface region. The junction termination is constructed by providing a guard ring adjacent to the surface region, and providing a field stop outside of the guard ring, and arranging at least two field limiting rings, FLRs, between the guard and the field stop, where a first FLR is arranged at a distance $\Delta_1$ from the guard selected from the interval [4 µm; 12 µm], a second FLR is arranged at a distance $\Delta_2$ from the first FLR selected from the interval [6.5 µm; 15 µm], the distances are selected so that the distance $\Delta_2$ is larger than the distance $\Delta_1$.

Embodiments of the proposed technology enables an X-ray detector that have a well-balanced and even distribution of electrical field peaks along the FLRs even for a very low number of FLRs. The particular configurations of FLRs according to the proposed technology enables in addition, due to the low number of FLRs, an X-ray detector with an increased active detector area since the sparse area is not occupied by a larger number of FLRs.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which:

FIGS. 16a-16f are graphs illustrating the beneficial electric field distributions that are obtained by a still another particular example of the proposed technology where four FLRs are used.

FIGS. 18a-18f are graphs illustrating the beneficial electric field distributions that are obtained by yet another particular example of the proposed technology where six FLRs are used.

DETAILED DESCRIPTION

Throughout the drawings, the same reference designations are used for similar or corresponding elements.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Figure 1:
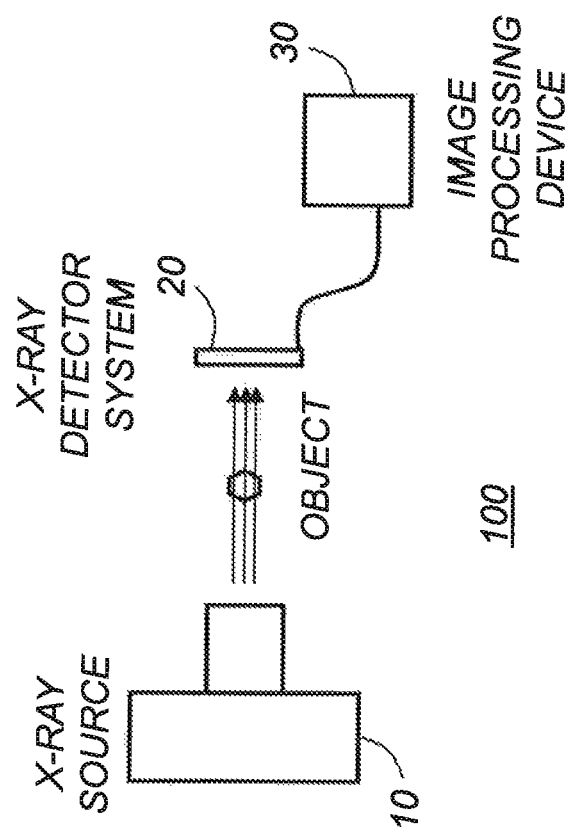
FIG. 1 is a schematic diagram illustrating an example of an overall X-ray imaging system.

For a better understanding of the proposed technology, it may be useful to begin with a brief system overview and/or analysis of the technical problem. To this end reference is made to FIG. 1. In this non-limiting example, the X-ray imaging system 100 basically comprises an X-ray source 10, an X-ray detector system 20 and an associated image processing device 30. In general, the X-ray detector system 20 is configured for registering radiation from the X-ray source 10 that may have been focused by optional X-ray optics and passed an object or subject or part thereof. The X-ray detector system is connectable to the image processing device 30 via suitable analog processing and read-out electronics which may be integrated in the X-ray detector system 20 to enable image processing and/or image reconstruction by the image processing device 30.

Figure 2:
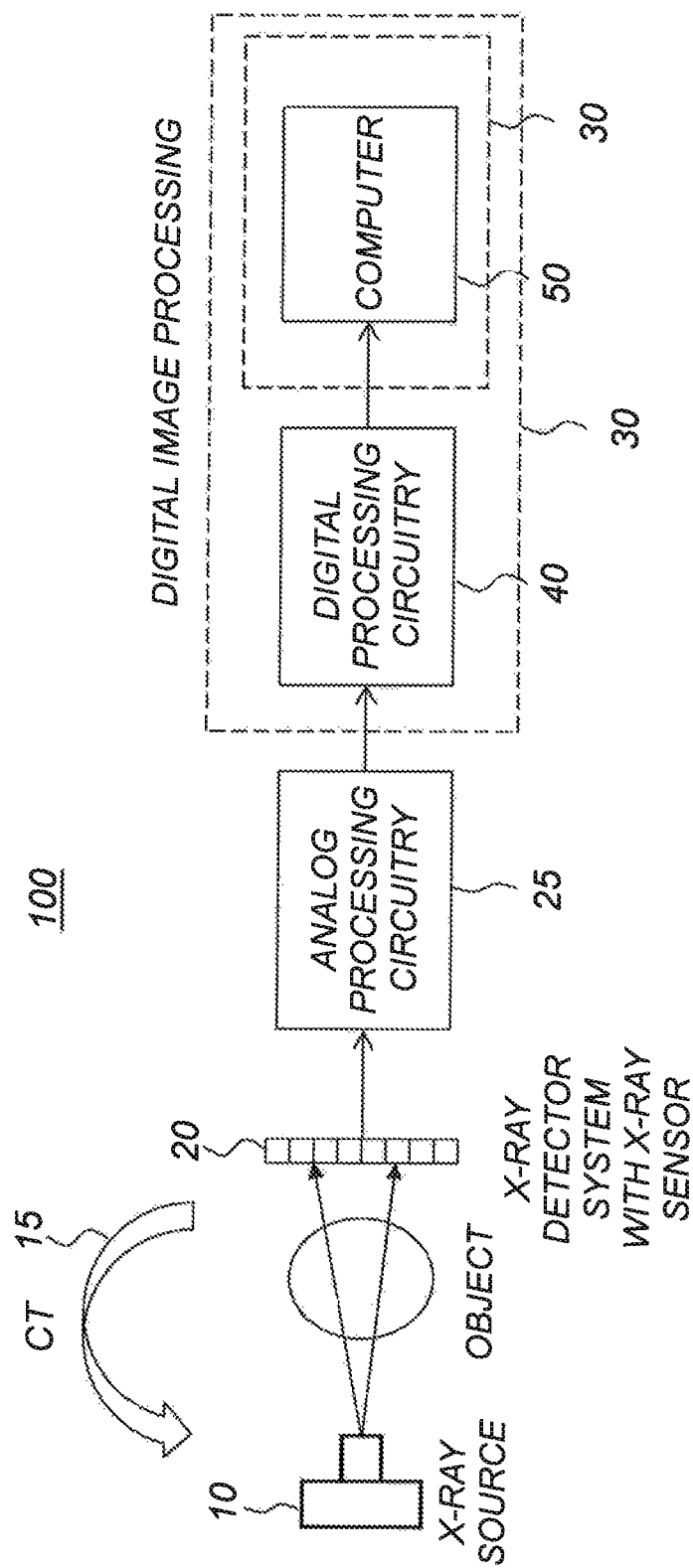
FIG. 2 is a schematic diagram illustrating another example of an X-ray imaging system.

As illustrated in FIG. 2, another example of an X-ray imaging system 100 comprises an X-ray source 10, which emits X-rays; an X-ray detector system 20, which detects the X-rays after they have passed through the object; analog processing circuitry 25, which processes the raw electrical signal from the detector and digitizes it; digital processing circuitry 40 which may carry out further processing operations on the measured data such as applying corrections, storing it temporarily, or filtering; and a computer 50 which stores the processed data and may perform further post-processing and/or image reconstruction.

The overall detector may be regarded as the X-ray detector system 20, or the X-ray detector system 20 combined with the associated analog processing circuitry 25.

The digital part including the digital processing circuitry 40 and/or the computer 50 may be regarded as a digital image processing system 30, which performs image reconstruction based on the image data from the X-ray detector. The image processing system 30 may thus be seen as the computer 50, or alternatively the combined system of the digital processing circuitry 40 and the computer 50, or possibly the digital processing circuitry 40 by itself if the digital processing circuitry is further specialized also for image processing and/or reconstruction.

An example of a commonly used X-ray imaging system is a Computed Tomography CT system, which may include an X-ray source that produces a fan or cone beam of X-rays and an opposing X-ray detector system for registering the fraction of X-rays that are transmitted through a patient or object. The X-ray source and detector system are normally mounted in a gantry that rotates around the imaged object.

Accordingly, the X-ray source 10 and the X-ray detector system 20 illustrated in FIG. 2 may thus be arranged as part of a CT system, e.g. mountable in a CT gantry.

Modern X-ray detectors normally need to convert the incident X-rays into electrons, this typically takes place through photo absorption or through Compton interaction and the resulting electrons are usually creating secondary visible light until its energy is lost and this light is in turn detected by a photo-sensitive material. There are also detectors, which are based on semiconductors and in this case the electrons created by the X-ray are creating electric charge in terms of electron-hole pairs which are collected through an applied electric field.

Conventional X-ray detectors are energy integrating, the contribution from each detected photon to the detected signal is therefore proportional to its energy, and in conventional CT, measurements are acquired for a single energy distribution. The images produced by a conventional CT system therefore have a certain look, where different tissues and materials show typical values in certain ranges.

Photon counting detectors have also emerged as a feasible alternative in some applications; currently those detectors are commercially available mainly in mammography. The photon counting detectors have an advantage since in principle the energy for each X-ray can be measured which yields additional information about the composition of the object. This information can be used to increase the image quality and/or to decrease the radiation dose.

Compared to the energy-integrating systems, photon-counting CT has the following advantages. Firstly, electronic noise that is integrated into the signal by the energy-integrating detectors can be rejected by setting the lowest energy threshold above the noise floor in the photon-counting detectors. Secondly, energy information can be extracted by the detector, which allows improving contrast-to-noise ratio by optimal energy weighting and which also allows so-called material basis decomposition, by which different materials and/or components in the examined subject or object can be identified and quantified, to be implemented effectively. Thirdly, more than two basis materials can be used which benefits decomposition techniques, such as K-edge imaging whereby distribution of contrast agents, e.g. iodine or gadolinium, are quantitatively determined. Fourth, there is no detector afterglow, meaning that high angular resolution can be obtained. Last but not least, higher spatial resolution can be achieved by using smaller pixel size.

The most promising materials for photon-counting X-ray detectors are cadmium telluride CdTe, cadmium zinc telluride CZT and silicon Si. CdTe and CZT are employed in several photon-counting spectral CT projects for the high absorption efficiency of high-energy X-rays used in clinical CT. However, these projects are slowly progressing due to several drawbacks of CdTe/CZT. CdTe/CZT have low charge carrier mobility, which causes severe pulse pileup at flux rates ten times lower than those encountered in clinical practice. One way to alleviate this problem is to decrease the pixel size, whereas it leads to increased spectrum distortion as a result of charge sharing and K-escape. Also, CdTe/CZT suffer from charge trapping, which would lead to polarization that causes a rapid drop of the output count rate when the photon flux reaches above a certain level.

In contrast, silicon has higher charge carrier mobility and is free from the problem of polarization. The mature manufacturing process and comparably low cost are also its advantages. But silicon has limitations that CdTe/CZT does not have. Silicon sensors must accordingly be quite thick to compensate for its low stopping power. Typically, a silicon sensor needs a thickness of several centimeters to absorb most of the incident photons, whereas CdTe/CZT needs only several millimeters. On the other hand, the long attenuation path of silicon also makes it possible to divide the detector into different depth segments, as will be explained below. This in turn makes it possible for a silicon-based photon-counting detector to properly handle the high fluxes in CT.

When using simple semiconductor materials, such as silicon or germanium, Compton scattering causes many X-ray photons to convert from a high energy to a low energy before conversion to electron-hole pairs in the detector. This results in a large fraction of the X-ray photons, originally at a higher energy, producing much less electron-hole pairs than expected, which in turn results in a substantial part of the photon flux appearing at the low end of the energy distribution. In order to detect as many of the X-ray photons as possible, it is therefore necessary to detect as low energies as possible.

A traditional X-ray sensor/detector design normally includes, on the top side, an active detector area covered by detector diode pixels, e.g. in the form of strips or rectangular or hexagonal areas p-type doped in the case the substrate is an n-type high resistivity material. According to the predominant trend in X-ray sensor/detector design, the top side also includes a so-called junction termination area. The proposed technology aims to provide an X-ray detector having an improved junction termination. The inventors have in particular realized that a specific distribution of FLRs yield electrical field peaks that are highly balanced over the FLRs. That is, the magnitude of the electrical field peaks are nearly the same over the FLRs. This follows from the particular distribution of the FLRs relative the guard ring of the junction termination. Before describing the features of the proposed X-ray sensor there will be provided a brief description of an X-ray sensor provided with FLRs. It should be noted FLRs are sometimes referred to as floating rings or even floating field limiting rings, FFLR.

Figure 3:
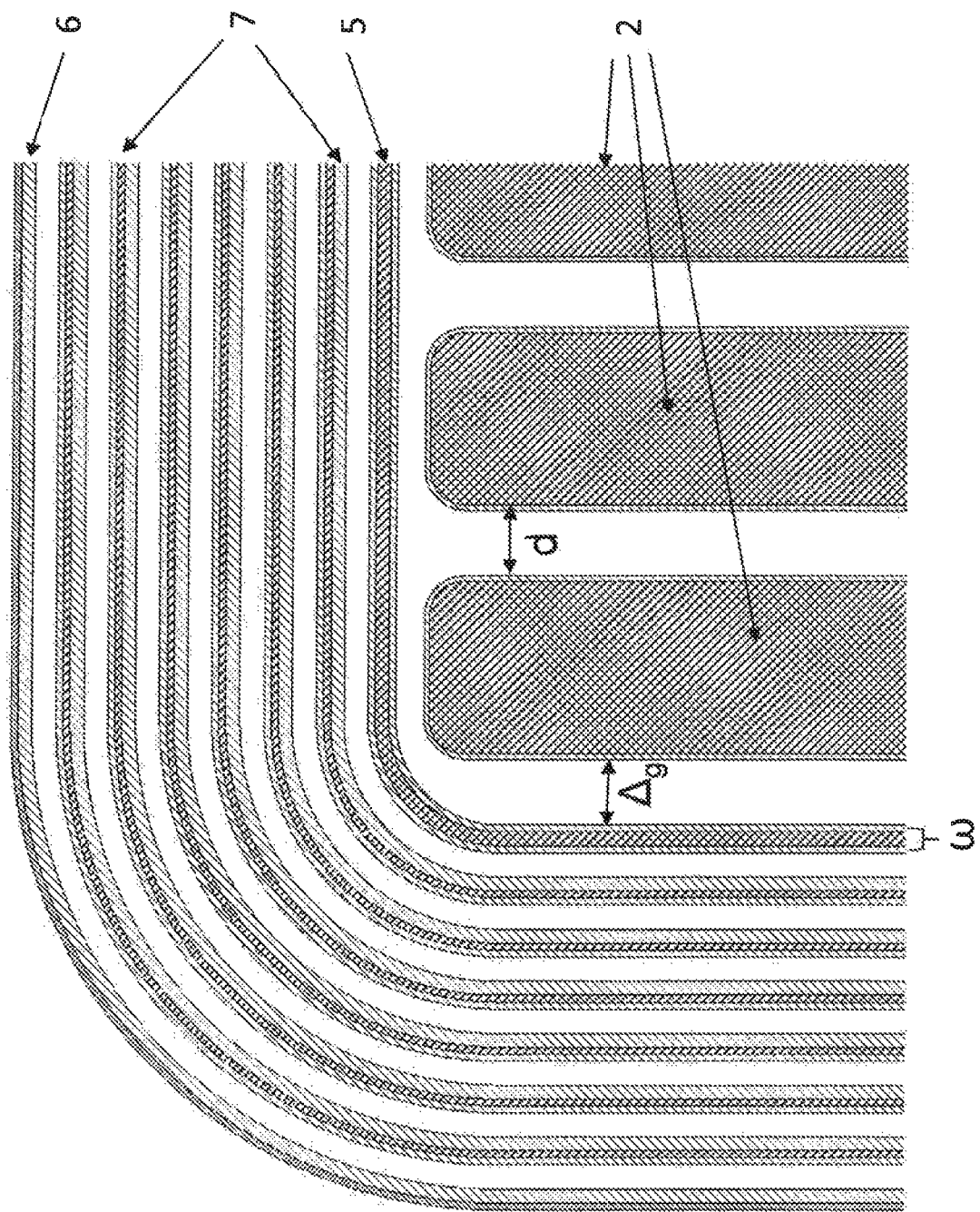
FIG. 3 is a schematic diagram illustrating an example of an X-ray sensor seen from a top view according to an embodiment.

In order to describe a sensor design utilizing FLRs, reference is made to FIG. 3. In FIG. 3 it is illustrated how a number of detector diodes 2, e.g., pixel diodes, are enclosed by a junction termination comprising a guard 5, sometimes referred to as a guard ring, a field stop 6 and a number of FLRs 7 arranged between the guard 5 and the field stop 6. In the sensor design depicted in FIG. 3 the function of the guard ring and that of FLRs are typically distinctly different and separated. The function of the FLRs is to control the electric field at the device periphery and at the surface of the device. Normally, the function of the guard ring is entirely to collect the leakage current generated at the periphery of the sensor being an array of pixel diodes. The FLR concept may be used to terminate high voltage planar p-n junctions and is based on the positioning of a number of diffused concentric rings of the same doping type as that of the highly doped side of the diode that surround the p-n junction. The electric potential is taken up by the spaces between the diffused rings upon the application of the reverse voltage to the diode. The diffused rings are often equipped with field plates in metal or polysilicon to spread and soften the electric field distribution close to the edges of the in-diffused p-n junctions created on both sides of the diffused rings.

Usually a large number of equidistant rings is required in order to keep the potential between the rings, and thus the surface electric field, low enough with respect to the passivating materials. The number of rings increases with the value of the blocking voltage and FLR termination is normally not space efficient since it requires a relatively large surface area. In addition to the FLR structure a field stop ring is often provided outside of the rings by using dopant of opposite type to the rings in order to prevent an expansion of the space charge region towards the defective edge area of the chip. The significance of the n-stop ring is only limited to the case of the surface charge of opposite polarity which means negative charge in the case of the n-type low doped detector bulk material and p-type anode region and p-type FLR rings. Normally positive surface charge is expected as a result of the X-ray exposure at the oxidized silicon surface.

A particular objective of the proposed FLR design, to be used for X-ray detectors, is to reduce the lateral extension of the termination in order to reduce the loss of active sensor area while at the same time ensuring that there is a balance among the electrical field peaks over the various FLRs. That is, that the magnitude of the electrical field peaks is comparatively the same over different FLRs.

The most space efficient termination is the one that results in a rectangular distribution of the surface electric field. This follows from the Poisson equation according to which blocking voltage is an integral of the electric field. In the case of the FLR termination the electric field distribution at the surface consists of a sum of triangular distributions from each of the spaces between the rings. In order to reduce the lateral expansion of the termination the spacing between the rings must be dimensioned in such a way as to secure equal electric field peak height in all the spacing and also to minimize the width of the diffused rings.

Furthermore, from the point of view of reliability, the quasi-uniform, equal field peaks distribution has to be maintained during the predicted life of the sensor. Under exposure to X-ray irradiation the build-up of positive surface charge takes place in the oxide close to the silicon and silicon dioxide interface. The positive surface charge causes shift of the electric field distribution towards the p-n junction periphery in the case of the highly doped side of the junction being p-type. This means that the electric field maxima belonging to the innermost rings increase and those of the outer rings decrease. The electric field distribution becomes skewed with maximum shifted towards the main p-n junction, i.e., the outer edge of the p-n junction belonging to the guard ring. The space efficient design must be geared in such way as to equalize the electric field maxima in full extension of the termination in the wide range of surface charge values or at least from approximately 0, i.e practically from $10^{10}$ cm$^{-2}$, to $1 \times 10^{12}$ cm$^{-2}$.

Based on this the proposed technology provides mechanisms whereby at least three complications are addressed. The proposed FLR distribution ensures a reduced lateral extension of the FFR junction termination. This in turn ensures a larger active detection area. The proposed FLR distribution also ensures a uniform surface electric field distribution. This means, in the case of FFR termination, a comparatively equal magnitude of the electric field peaks. The proposed FLR distribution also ensures a reduced sensitivity to the positive surface charge. This follows from the fact that the electric field distribution will be uniform up to the highest possible values of the concentration of positive surface charge. X-ray detectors are naturally exposed to X-ray radiation. It is known that X-ray radiation causes accumulation of the positive charge in the oxide covering the surface of the detector. The positive surface charge causes shift of the electric field distribution towards the guard and an increase of the electric field value between the guard and the first ring in the FFR termination. This causes an increase of the leakage current and finally a loss of the voltage blocking properties, i.e., a reduction of the maximum blocking voltage. This is part of the aging of the detector and constitutes an important feature impacting the lifetime of the detector in the application.

Figure 7:
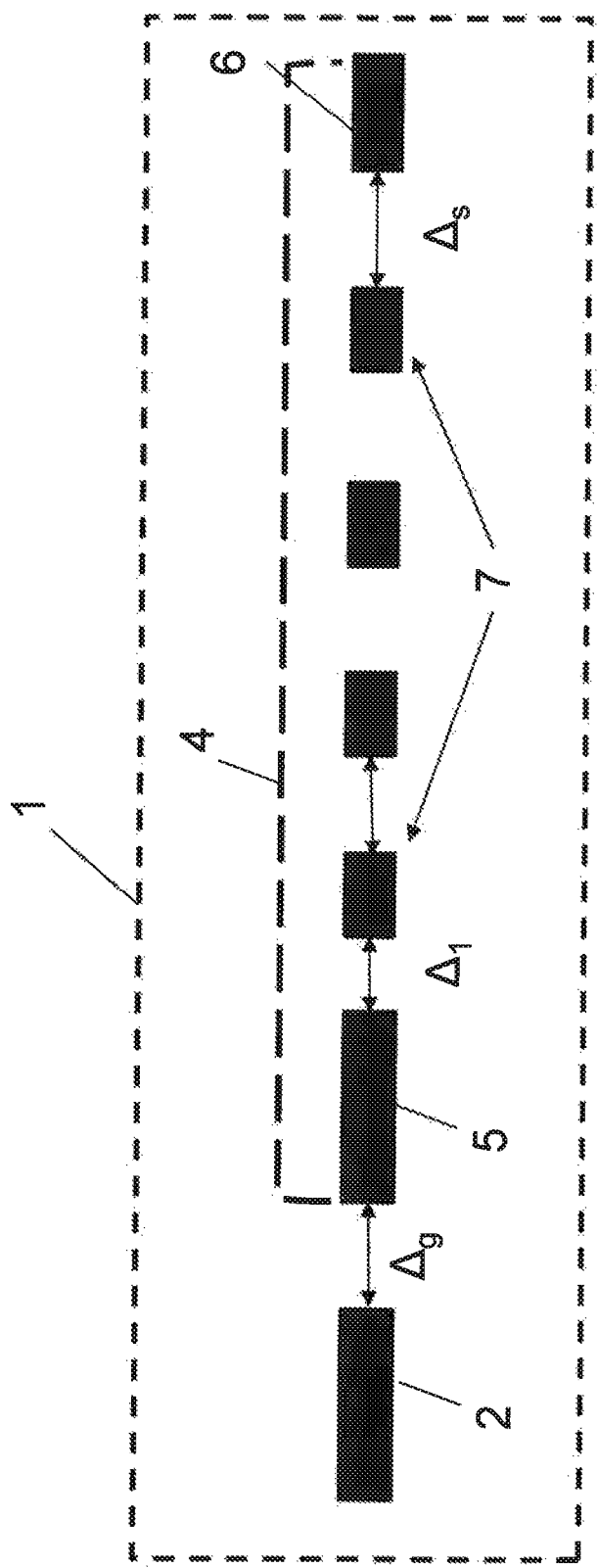
FIG. 7 is a schematic illustration of an X-ray sensor having Field Limiting Rings arranged with constant spacings or distances between adjacent rings.

Reference is now made to FIG. 7 which illustrates a cross-section of an X-ray sensor comprising a junction termination according to the sensor design depicted in FIG. 3. Here the schematically illustrated X-ray sensor 1 comprises detector diodes 2, a junction termination 4 and a field stop 6. The junction termination comprises in turn a guard 5 and a number of FLRs 7. The distances $\Delta$ between neighboring FLRs are constant in this configuration, i.e., it is the same distance $\Delta$ between each pair of neighboring FLRs including the distance $\Delta_1$ between the guard 5 and the first FLR 7. The drawing also illustrates two additional distances, a distance $\Delta_g$ between the guard ring 5 and the closest detector element 2 and a distance $\Delta_s$ between the last FLR and the field stop 6. It should be noted that the doping of the FLRs are opposite to the doping of the detector material but the same as the doping of the detector diodes 2 and of the guard ring 5. That is, if the detector material, e.g., silicon, is of n-type, then the doping of the FLRs are of p-type.

Before proceeding we provide a short description of the notation used in the present disclosure. With the notation $X_n$ is in what follows intended a distance from the center of a FLR to the outer edge of the guard. With the center of a FLR is intended the center or midpoint of the FLR with regard to the width dimension. If a FLR has a width $\sigma$ the center point of the FLR is located at $\sigma/2$. With the outer edge of guard is intended the edge of the guard that is closest to the FLRs. That is, the guard faces, on its inner side, the detector diodes 2, and on its opposing edge the guard faces the FLRs. The opposing edge is thus referred to as the outer edge. The notation $\Delta_n$ specifies the separation distance between neighboring FLRs or between the guard ring and its closest FLR, $\Delta_1$ may for example denote the separation distance between the guard and the first FLR, that is, the FLR that is provided closest to the guard. $\Delta_2$ may in the same manner denote the separation distance between the first FLR and the second FLR, etc. It should be noted that the separation distances refer to the distance between the edges of the FLRs that are facing each other. If the width of the FLRs are taken into consideration the distance between the center point of the first FLR and the center point of the second FLR will be given by $\Delta_2+\sigma$, where $\sigma$ is the width of a FLR.

Figure 8:
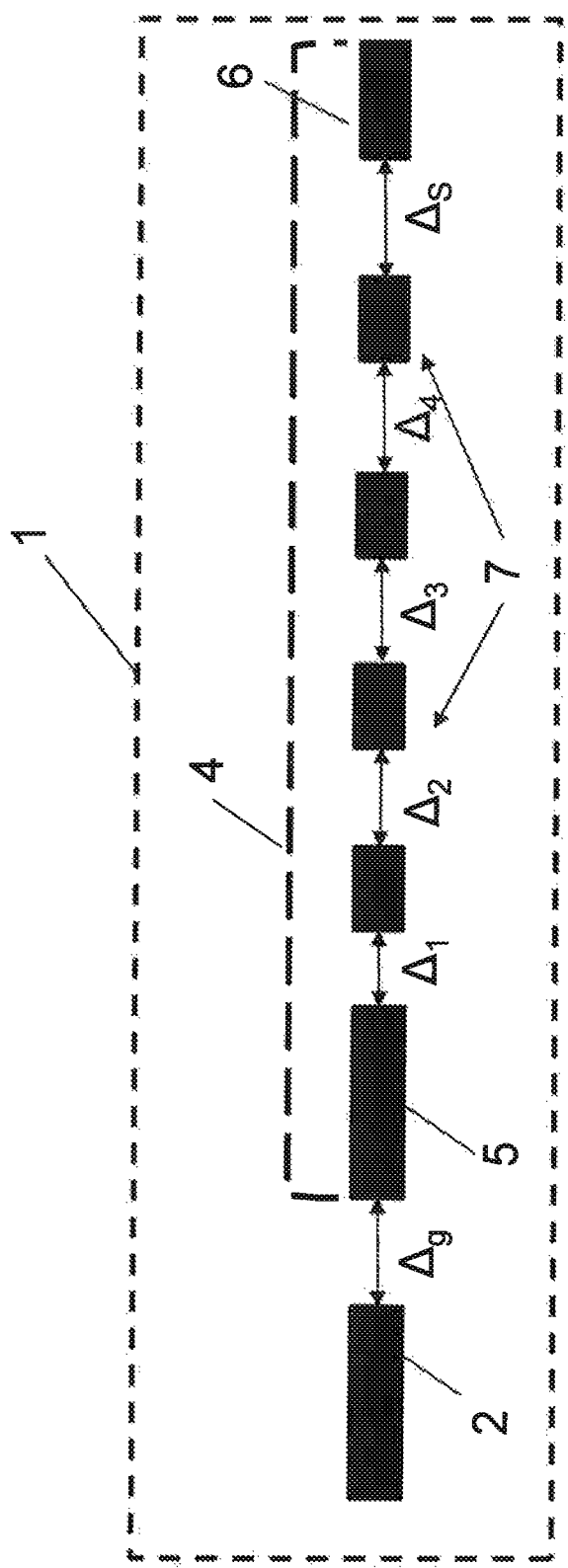
FIG. 8 is a schematic illustration of an X-ray sensor according to the proposed technology wherein the Field Limiting Rings, FLRs are arranged with different spacing between adjacent FLRs.

The proposed technology aims to improve upon the design illustrated in FIG. 7. It aims in particular to provide a specific design of the junction termination where individual FLRs are positioned in a particular way, i.e., where the distances between neighboring FLRs are specifically selected. With reference to FIG. 8, which illustrates the same cross-section as FIG. 7, the proposed technology provides an X-ray sensor where the specific distances $\Delta_n$ between adjacent FLRs are selected to achieve a particularly effective junction termination. For the design in FIG. 8, which comprises four FLRs, this corresponds to selecting four distances, $\Delta_1$, $\Delta_2$, $\Delta_3$ and $\Delta_4$, and optionally also the distance $\Delta_g$ between the guard ring and the closest detector diode 2 and the distance $\Delta_s$ between the last FLR and the field stop 6. A special limitation also applies to the distance $\Delta_g$ between the inner edge of the guard and outer edge of the detector diode that is closest to the guard. This distance should, according to the proposed technology, preferably be selected from the interval $20\ \mu m \leq \Delta_g \leq 30\ \mu m$.

Figure 4:
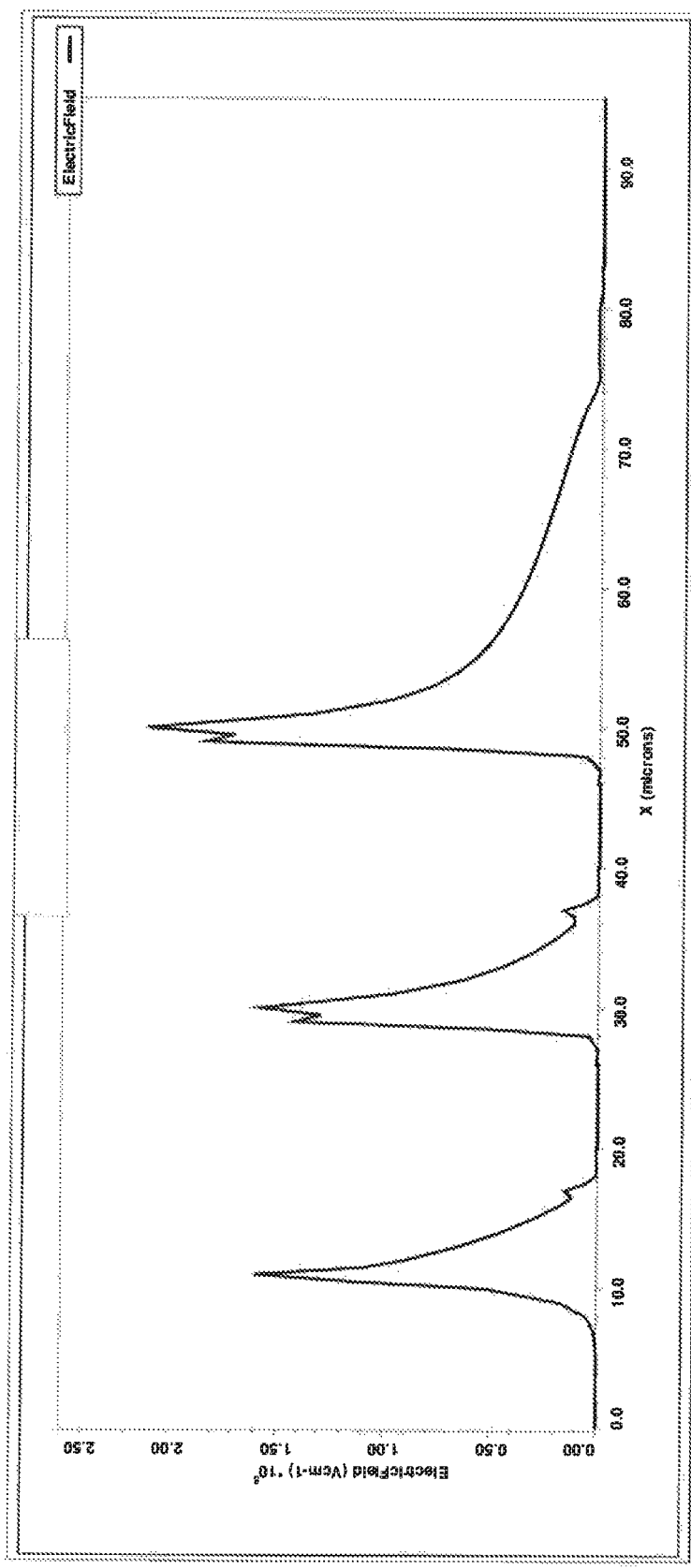
FIG. 4 is a graph illustrating a well-balanced electric field peak profile when two Field Limiting Rings, FLRs, are used in the junction termination.
Figure 5:
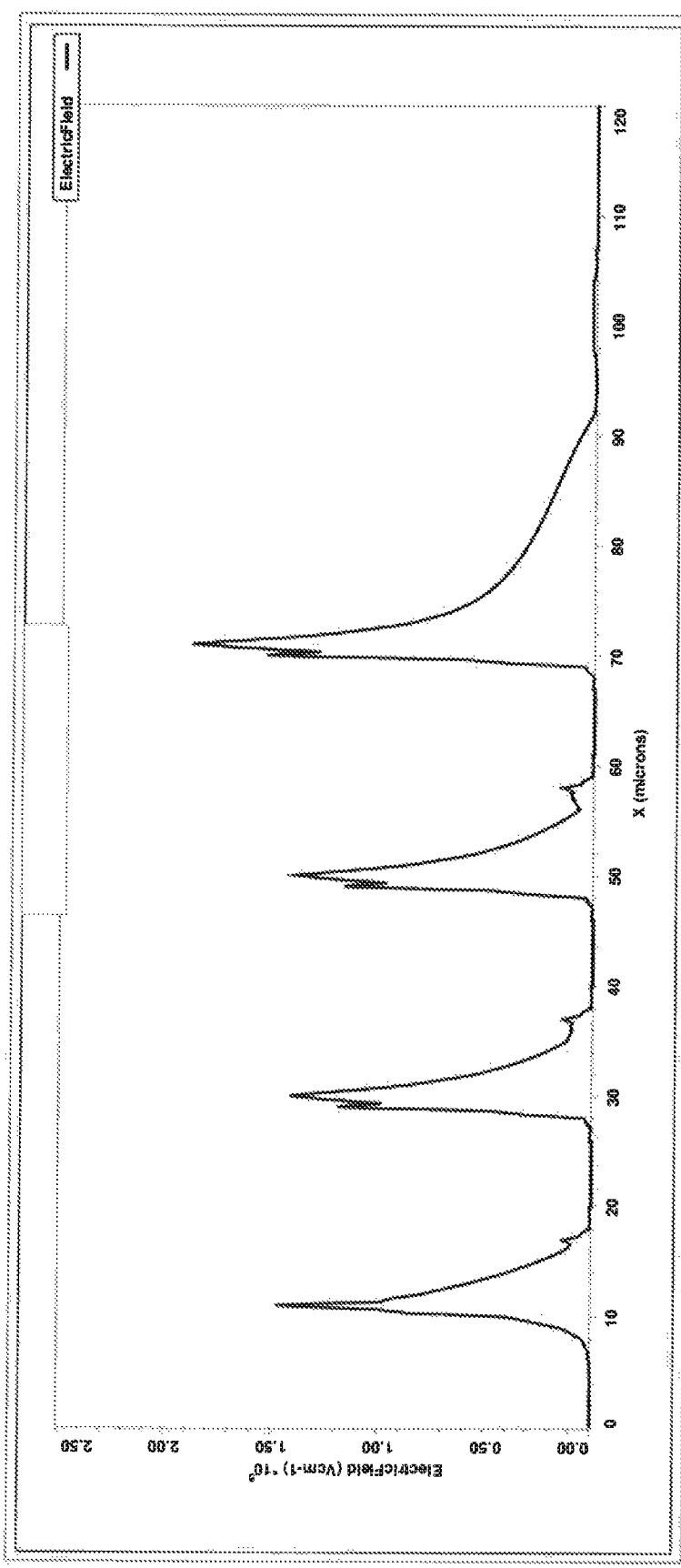
FIG. 5 is a graph illustrating a well-balanced electric field peak profile when three FLRs are used in the junction termination.
Figure 6:
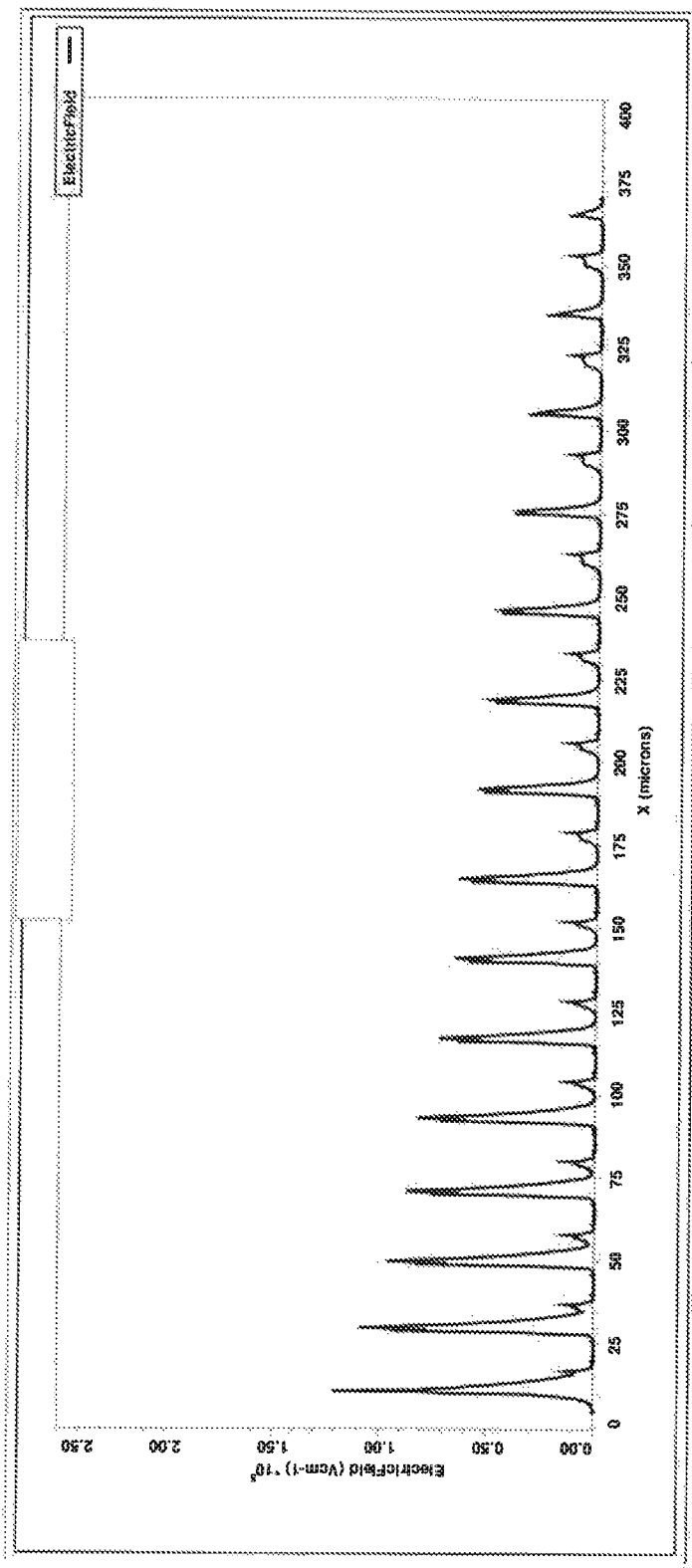
FIG. 6 is a graph illustrating an unbalanced electric field peak profile when a large number of equidistantly arranged Field Limiting Rings are used.

Before describing particular embodiments of the proposed technology there will be provided a more general description of the cooperating features underlying the sensor. The inventors have realized that a particularly important characteristic for a sensor with a junction termination using FLRs is to obtain a balanced field peak profile over all the FLRs. That is, the electric field peaks should preferably have the comparatively same magnitude over all FLRs. To highlight this insight reference is made to FIG. 6 which illustrates the electric field peaks of a particular junction termination that utilizes a relatively large number of equidistantly placed FLRs. As is clear from the graph there is a large difference in field peak magnitudes over the various FLRs. What is wanted is instead more of a profile as shown in e.g., FIGS. 4 and 5.

The inventors have also realized, as part of the overall inventive activity, that in order to increase the active detector area the number N of FLRs should preferably be rather small, preferably $N \leq 6$. This constraint is however contradictory with the aim of obtaining and even distribution of field peaks since such an even distribution of field peak magnitudes over the various FLRs indicates that a large number of FLRs are to be used while the desire to increase the active sensor region would require that the number of FLRs should be reduced. The inventors have however realized that a particular configuration of FLRs where the FLRs are distributed with specific distances relative the guard and their neighbors arrives at a junction termination with the sought for properties. These configurations applies to junction terminations that are equipped with six FLRs or lower, in particular those cases where the number N of FLRs are given by N=2, N=3, N=4, N=5 and N=6.

Figure 9:
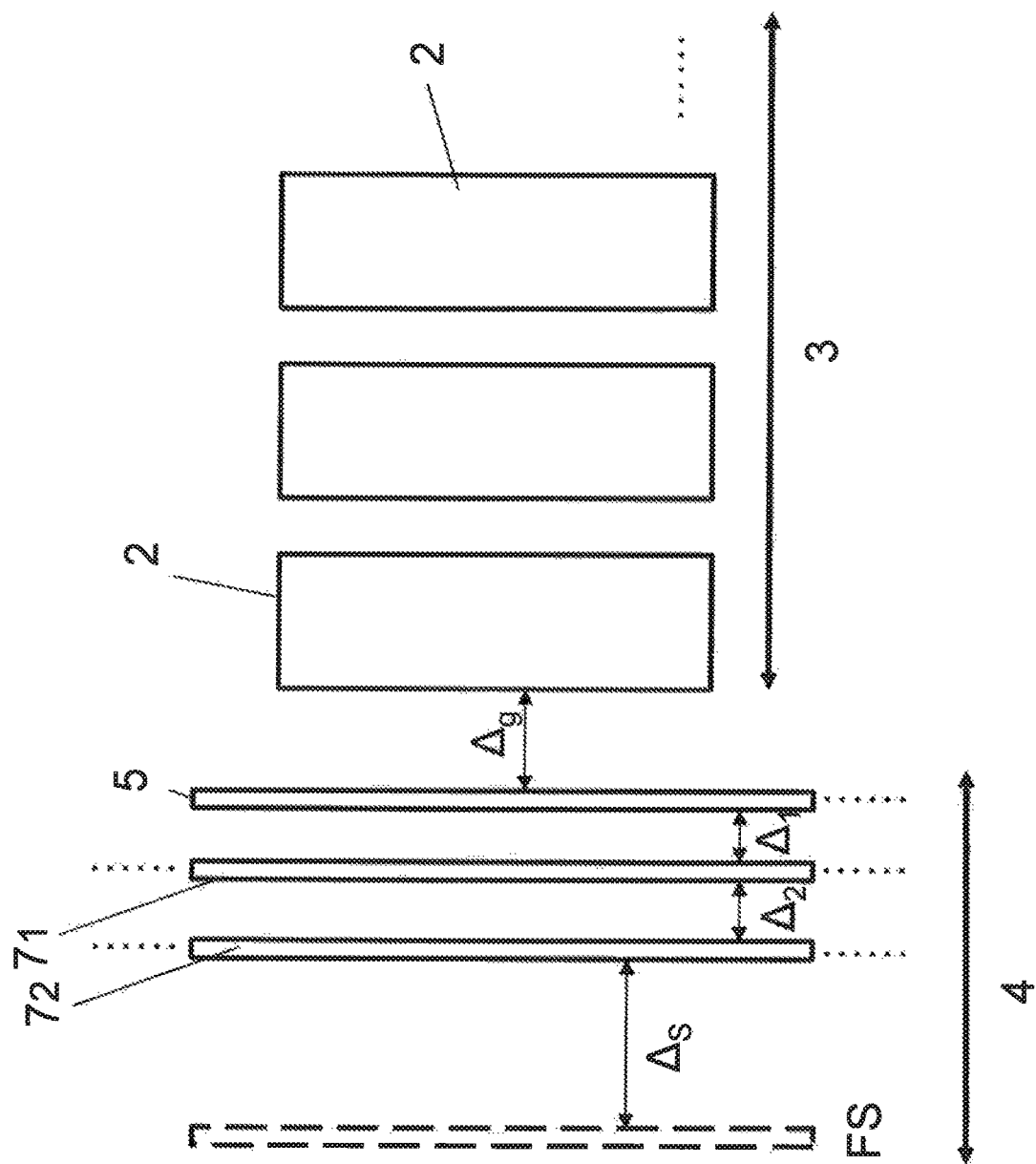
FIG. 9 is a schematic illustration of an X-ray sensor according to the proposed technology wherein the number of Field Limiting Rings, FLRs, are two.
Figure 10:
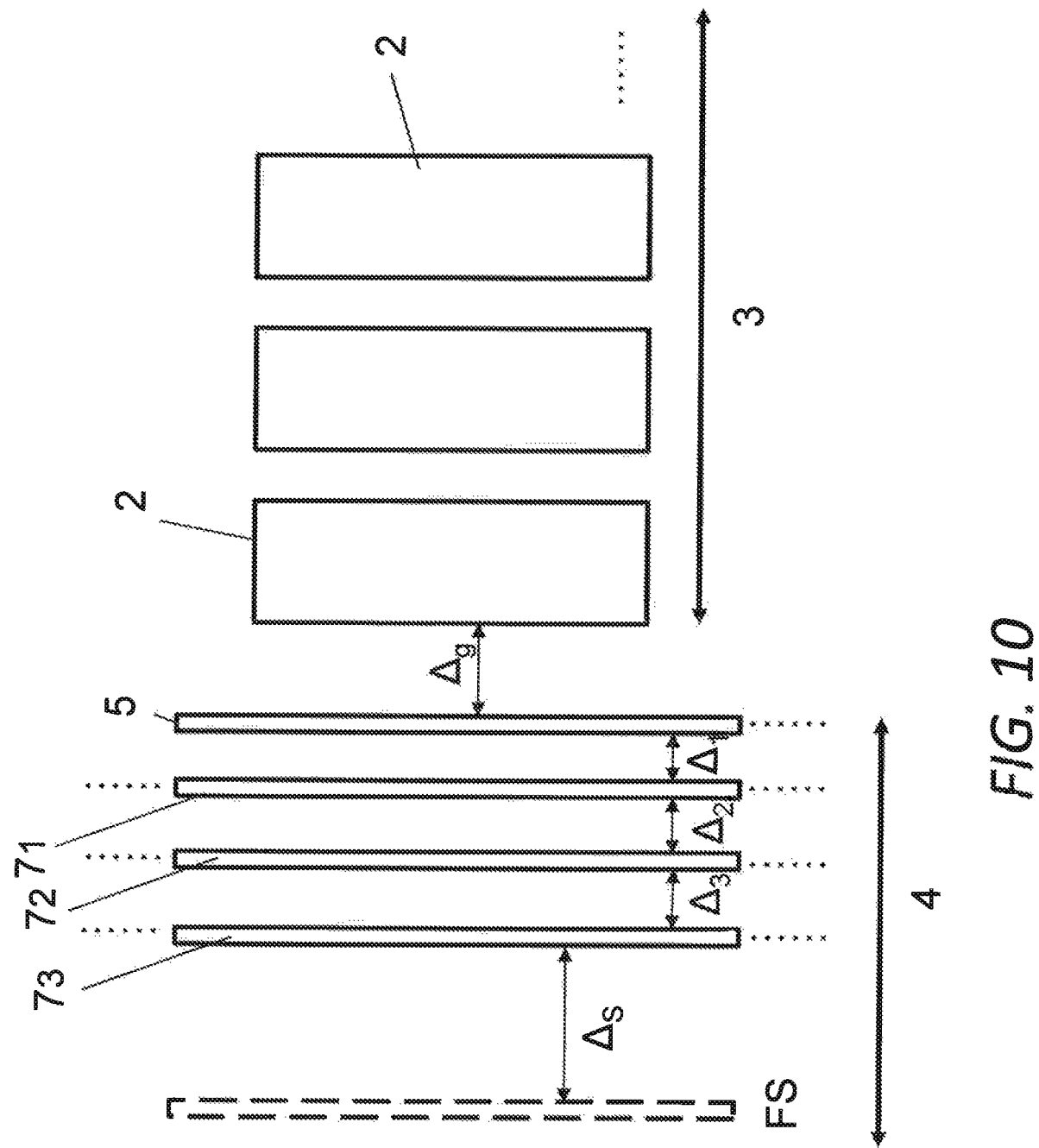
FIG. 10 is a schematic illustration of an X-ray sensor according to the proposed technology wherein the number of Field Limiting Rings, FLRs, are three.

FIG. 9 is a schematic diagram illustrating an X-ray sensor 1. The X-ray sensor 1 have an active detector region 3 comprising a plurality of detector diodes 2 arranged on a surface region of the X-ray sensor 1. The X-ray sensor 1 further comprising a junction termination 4 surrounding the surface region 3 comprising the plurality of detector diodes 2. The junction termination 4 comprises a guard 5 arranged closest to the end of the surface region 3, a field stop 6 arranged outside the guard 5 and at least two field limiting rings, FLRs, arranged between the guard 5 and the field stop 6, wherein a first FLR $7_1$ is arranged at a distance $\Delta_1$ from the guard 5 selected from the interval [4 μm; 12 μm] and a second FLR $7_2$ is arranged at a distance $\Delta_2$ from the first FLR $7_1$ selected from the interval [6.5 μm; 15 μm]. According to the proposed technology an additional constraint is that the distance $\Delta_2$ should be larger than the distance $\Delta_1$.

There is in other words provided an X-ray sensor 1 having a junction termination that comprises at least two FLRs that are provided in a particular configuration, with specifically selected distances relative each other and the guard 5. The distances chosen are preferably selected for the first two FLRs, those that are closest to the guard 5, in junction terminations that comprises 2, 3, 4, 5 or 6 FLRs. The distances chosen yields the surprising result that an even field peak distribution over the FLRs can be achieved with a very limited number of FLRs.

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

According to an effective embodiment of the proposed technology there is provided an x-ray sensor, wherein the distance $\Delta_1$ is 10±0.5 μm and the distance $\Delta_2$ is 13±0.5 μm. The following constraints should also be fulfilled, namely that the distance $\Delta_2$ is larger than the distance $\Delta_1$.

There is in other words provided an X-ray sensor 1 having a junction termination that comprises at least two FLRs that are provided in a particular distance configuration, relative each other and the guard 5. The selected distances have been shown to yield an even field peak distribution over the FLRs despite the fact that merely two FLRs are used.

FIG. 9 gives a schematic illustration of a particular embodiment of an X-ray sensor 1 according to the proposed technology. The X-ray sensor 1 comprises a junction termination 4 which is illustrated adjacent the surface region 3 comprising the plurality of detector diodes 2, in reality it is surrounding the whole surface region 3, see FIG. 3 for an illustration. The junction termination 4 comprises a guard 5 that is arranged closest to the end of the surface region 3, a field stop 6 that is arranged outside the guard 5 and two field limiting rings, FLRs, arranged between the guard 5 and the field stop 6. According to the proposed technology the first FLR $\mathbf{7}_1$ is arranged at a distance $\Delta_1$ from the guard 5 selected from the interval [4 μm; 12 μm], the second FLR $\mathbf{7}_2$ is arranged at a distance $\Delta_2$ from the first FLR Ti selected from the interval [6.5 μm; 15 μm]. According to the proposed technology the additional constraint that the distance $\Delta_2$ larger than the distance $\Delta_1$, should also be fulfilled.

By way of example, the distance $\Delta_s$ between the second FLR and the field stop 6 is preferably selected from the interval [20 μm; 50 μm], preferably from the interval [40 μm; 50 μm]. The distance $\Delta_g$ between the innermost FLR and the detector diodes closest thereto should, according to an embodiment of the proposed technology, preferably be selected from the interval [20 μm; 30 μm].

FIGS. 14a-14f provides graphs that illustrates the beneficial electric field distribution that is obtained by the proposed technology for a particular selection of distances within the mentioned intervals and for positive surface charge density as different as $1\times10^{11}$ cm$^{-2}$ and $5\times10^{11}$ cm$^{-2}$.

Figure 14B:
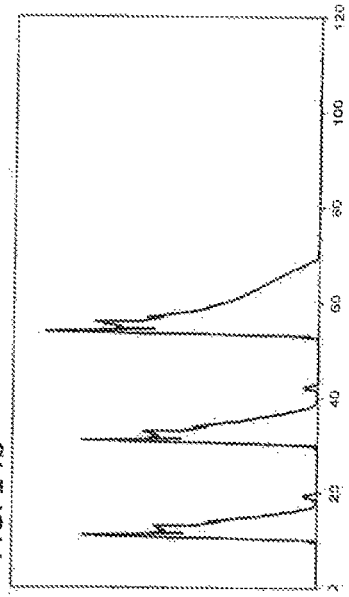
FIGS. 14a-14f are graphs illustrating the beneficial electric field distributions that are obtained by a particular example of the proposed technology where two FLRs are used.
Figure 14D:
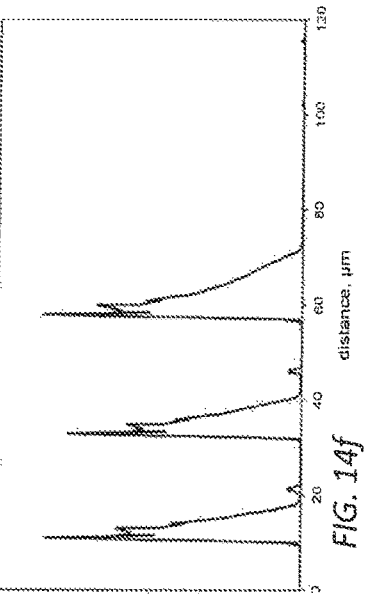
Figure 14F:
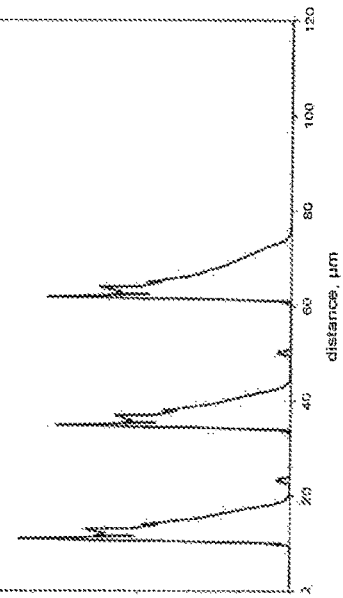
Figure 14A:
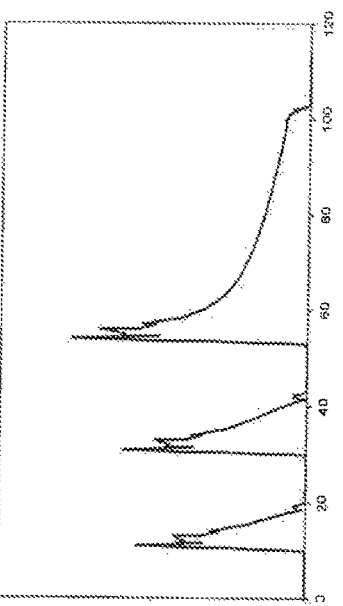

FIG. 14a illustrates a junction termination having two FLRs and a field stop. The distance between the guard ring and the first FLR is in this particular graph 8 μm and the distance between the first FLR and the second FLR is 11 μm. These values fall within the specified intervals and yields a well-balanced peak distribution over the termination in the case of positive surface charge density of $1\times10^{11}$ cm$^{-2}$.

FIG. 14b illustrates a junction termination having two FLRs arranged between the guard ring and the field stop. The distance between the guard ring and the first FLR is in this particular graph 8 μm and the distance between the first FLR and the second FLR is 11 μm. These values fall within the specified intervals and yields a well-balanced peak distribution over the termination also in the case of positive surface charge density of $5\times10^{11}$ cm$^{-2}$.

Figure 14C:
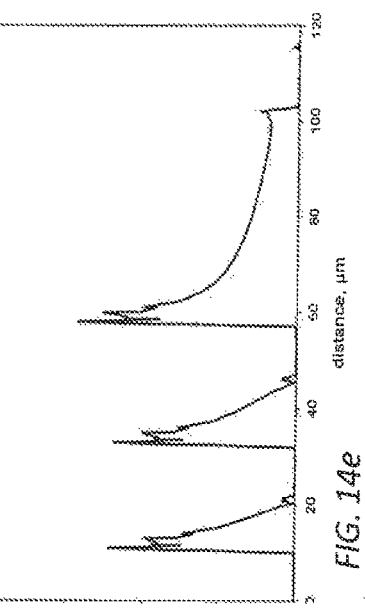

FIG. 14c illustrates a junction termination having two FLRs arranged between the guard ring and the field stop. The distance between the guard ring and the first FLR is in this particular graph 10 μm and the distance between the first FLR and the second FLR is 13 μm. These values fall within the specified intervals and yields a well-balanced peak distribution over the termination in the case of positive surface charge density of $1\times10^{11}$ cm$^{-2}$.

FIG. 14d illustrates a junction termination having two FLRs arranged between the guard ring and the field stop. The distance between the guard ring and the first FLR is in this particular graph 10 μm and the distance between the first FLR and the second FLR is 13 μm. These values fall within the specified intervals and yields a well-balanced peak distribution over the termination also in the case of positive surface charge density of $5\times10^{11}$ cm$^{-2}$.

Figure 14E:
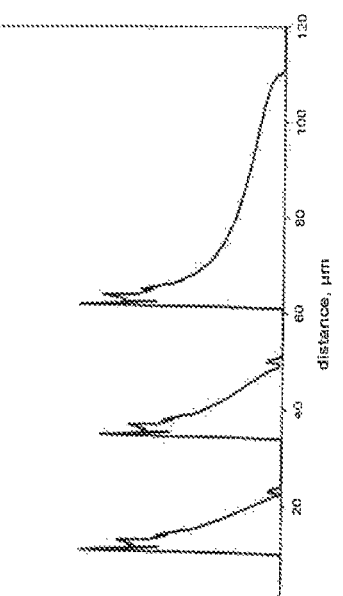

FIG. 14e illustrates a junction termination having two FLRs arranged between the guard ring and the field stop. The distance between the guard ring and the first FLR is in this particular graph 12 μm and the distance between the first FLR and the second FLR is 15 μm. These values fall within the specified intervals and yields a well-balanced peak distribution over the termination in the case of positive surface charge density of $1\times10^{11}$ cm$^{-2}$.

FIG. 14f illustrates a junction termination having two FLRs arranged between the guard ring and the field stop. The distance between the guard ring and the first FLR is in this particular graph 12 μm and the distance between the first FLR and the second FLR is 15 μm. These values fall within the specified intervals and yields a well-balanced peak distribution over the termination also in the case of positive surface charge density of $5\times10^{11}$ cm$^{-2}$.

Another possible embodiment of the proposed X-ray sensor 1 comprises a junction termination 4 which is illustrated adjacent the surface region 3 comprising the plurality of detector diodes 2, in reality it is surrounding the whole surface region 3, see FIG. 3 for an illustration. The junction termination 4 comprises a guard 5 that is arranged closest to the end of the surface region 3, a field stop 6 that is arranged outside the guard 5 and at least three field limiting rings, FLRs, arranged between the guard 5 and the field stop 6. According to the proposed technology the first FLR $\mathbf{7}_1$ is arranged at a distance $\Delta_1$ from the guard 5 selected from the interval [7 μm; 11 μm], the second FLR $\mathbf{7}_2$ is arranged at a distance $\Delta_2$ from the first FLR Ti selected from the interval [10 μm; 14 μm], and the third FLR $\mathbf{7}_3$ arranged at a distance $\Delta 3$ from the second FLR $\mathbf{7}_2$ selected from the interval [13 μm; 17 μm]. The following constraints should also be fulfilled, namely that the distance $\Delta_2$ is larger than the distance $\Delta_1$ and the distance $\Delta 3$ is larger than the distance $\Delta_2$.

By way of example, the distance $\Delta_s$ between the third FLR and the field stop 6 is preferably selected from the interval [20 μm; 50 μm], preferably from the interval [40 μm; 50 μm]. The distance $\Delta_g$ between the innermost FLR and the detector diodes closest thereto should, according to an embodiment of the proposed technology, preferably be selected from the interval [20 μm; 30 μm].

FIGS. 15a-15f provides graphs that illustrates the electric field distribution that is obtained by the proposed technology for a particular selection of distances within the mentioned intervals and a given surface charge. The vertical axis correspond to the electrical field on the surface and the horizontal axis are distance in μm.

Figure 15A:
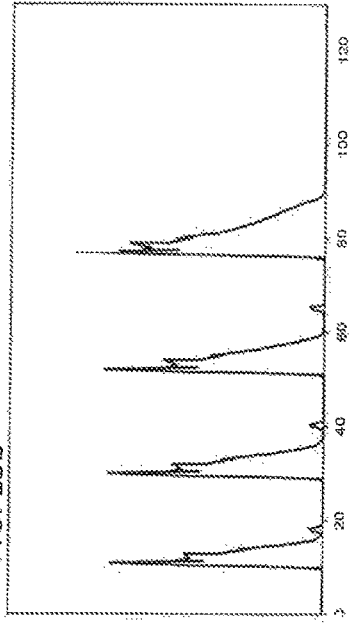
FIGS. 15a-15f are graphs illustrating the beneficial electric field distributions that are obtained by another particular example of the proposed technology where three FLRs are used.

FIG. 15a illustrates a junction termination having three FLRs and a field stop. The distance between the guard ring and the first FLR is in this particular graph 7 µm, the distance between the first FLR and the second FLR is 10 µm and the distance between the second FLR and the third FLR is 13 µm. These values fall within the specified intervals and yield a well-balanced peak distribution over the termination in the case of positive surface charge density of $1\times10^{11}$ cm$^{-2}$.

Figure 15B:
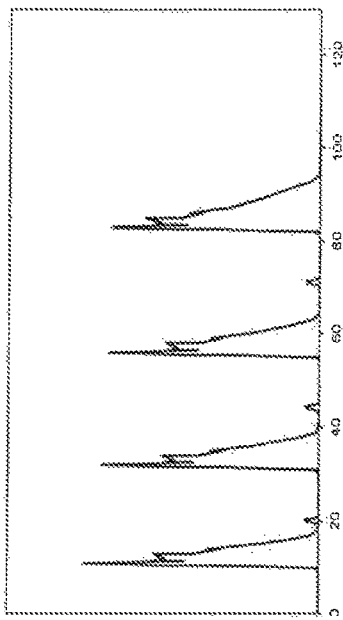

FIG. 15b illustrates a junction termination having three FLRs arranged between the guard ring and the field stop. The distance between the guard ring and the first FLR is in this particular graph 7 µm, the distance between the first FLR and the second FLR is 10 µm and the distance between the second FLR and the third FLR is 13 µm. These values fall within the specified intervals and yield a well-balanced peak distribution over the termination also for the case when the positive surface charge density is $5\times10^{11}$ cm$^{-2}$.

Figure 15C:
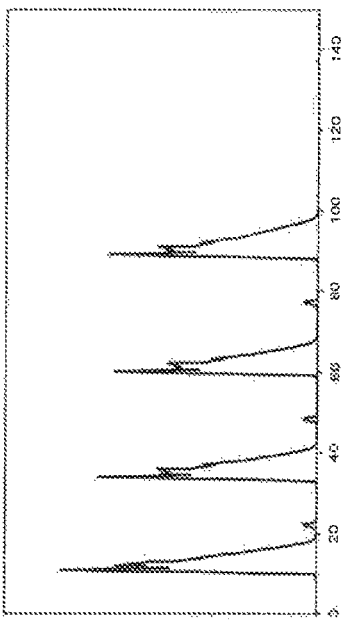

FIG. 15c illustrates a junction termination having three FLRs arranged between the guard ring and the field stop. The distance between the guard ring and the first FLR is in this particular graph 9 µm, the distance between the first FLR and the second FLR is 12 µm and the distance between the second FLR and the third FLR is 15 µm. These values fall within the specified intervals and yield a well-balanced peak distribution over the termination in the case of positive surface charge density of $1\times10^{11}$ cm$^{-2}$.

Figure 15D:
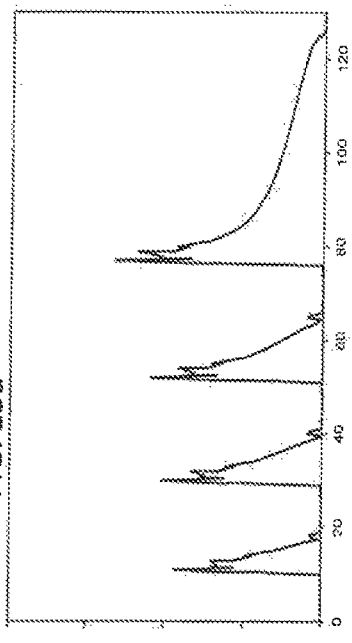

FIG. 15d illustrates a junction termination having three FLRs arranged between the guard ring and the field stop. The distance between the guard ring and the first FLR is in this particular graph 9 µm, the distance between the first FLR and the second FLR is 12 µm and the distance between the second FLR and the third FLR is 15 µm. These values fall within the specified intervals and yield a well-balanced peak distribution over the termination also in the case when the positive surface charge density is $5\times10^{11}$ cm$^{-2}$.

Figure 15E:
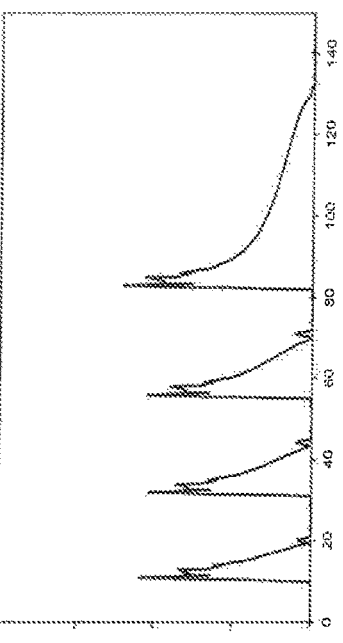

FIG. 15e illustrates a junction termination having three FLRs arranged between the guard ring and the field stop. The distance between the guard ring and the first FLR is in this particular graph 11 µm, the distance between the first FLR and the second FLR is 14 µm and the distance between the second FLR and the third FLR is 17 µm. These values fall within the specified intervals and yield a well-balanced peak distribution over the termination in the case of positive surface charge density of $1\times10^{11}$ cm$^{-2}$.

Figure 15F:
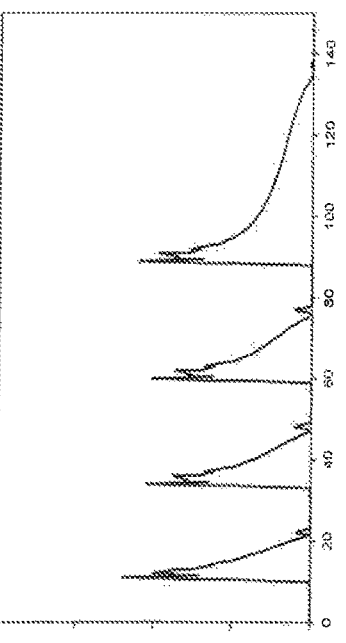

FIG. 15f illustrates a junction termination having three FLRs arranged between the guard ring and the field stop. The distance between the guard ring and the first FLR is in this particular graph 11 µm, the distance between the first FLR and the second FLR is 14 µm and the distance between the second FLR and the third FLR is 17 µm. These values fall within the specified intervals and yield a well-balanced peak distribution over the termination also when the positive surface charge density is $5\times10^{11}$ cm$^{-2}$.

According to a preferred embodiment of the proposed technology there is provided an X-ray sensor wherein the distance $\Delta_1$ is 9±0.5 µm, the distance $\Delta_2$ is 12±0.5 µm, and the distance $\Delta_3$ is 15±0.5 µm. The following constraints should also be fulfilled, namely that the distance $\Delta_2$ is larger than the distance $\Delta_1$ and the distance $\Delta_3$ is larger than the distance $\Delta_2$.

Figure 11:
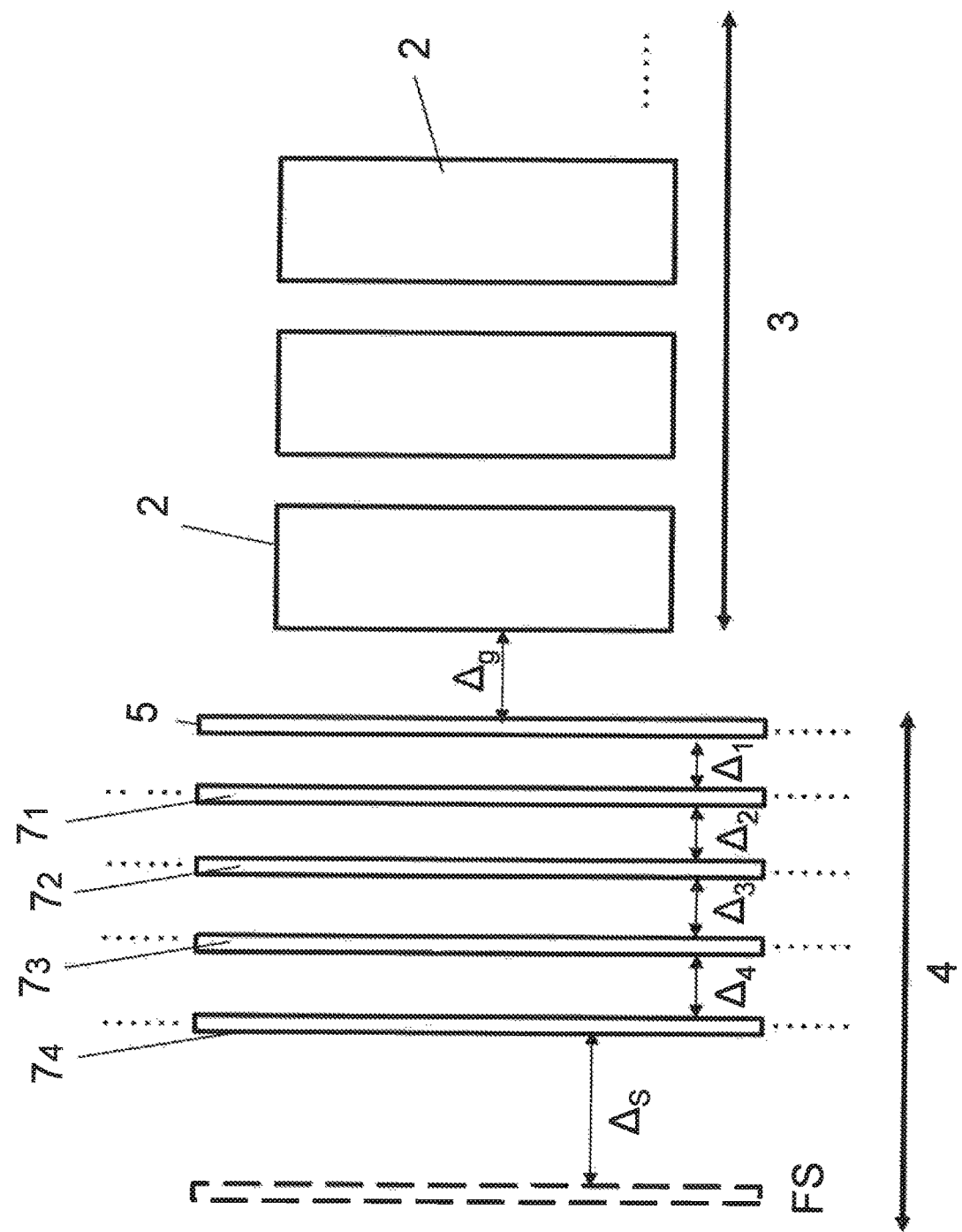
FIG. 11 is a schematic illustration of an X-ray sensor according to the proposed technology wherein the number of Field Limiting Rings, FLRs, are four.
Figure 12:
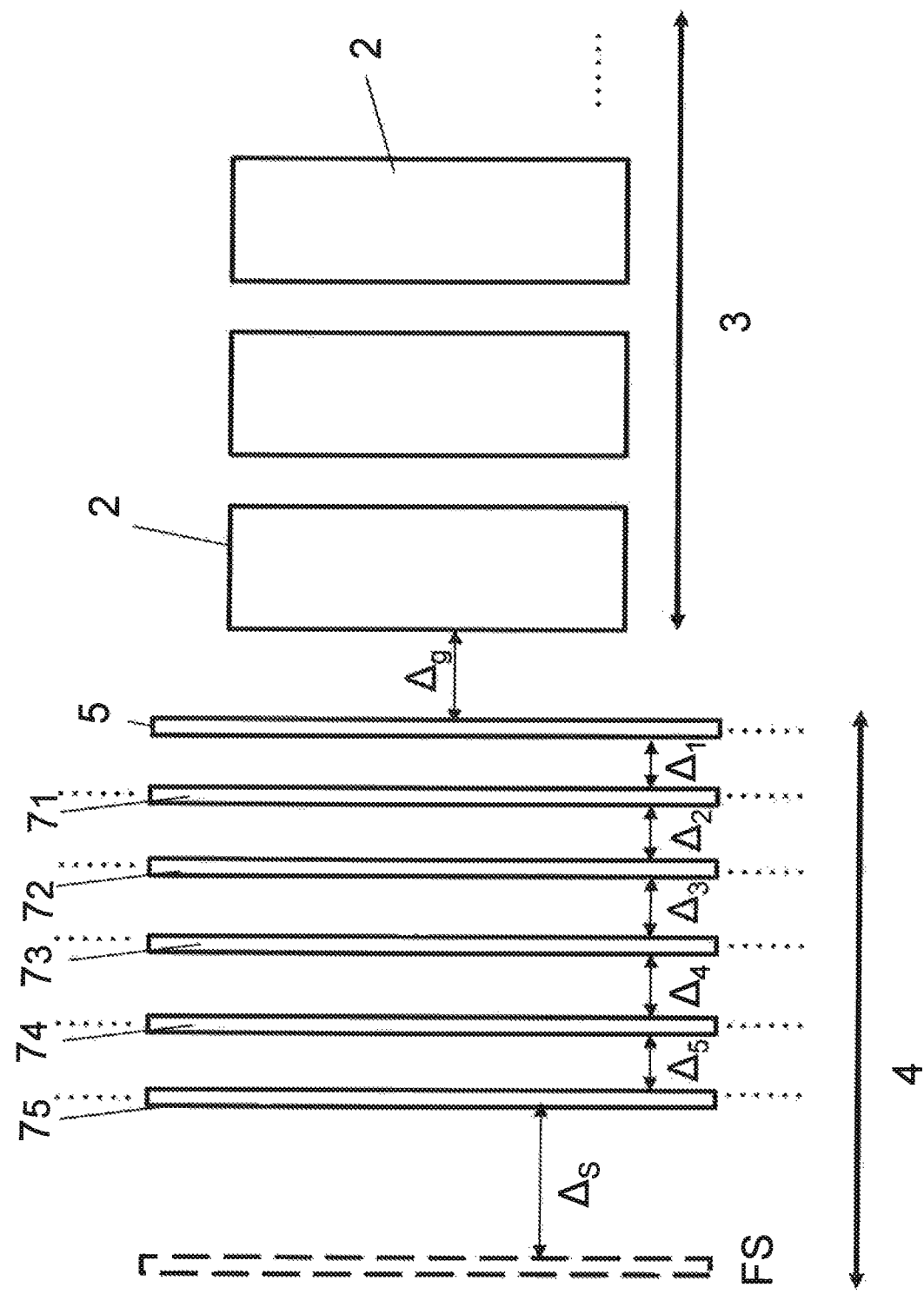
FIG. 12 is a schematic illustration of an X-ray sensor according to the proposed technology wherein the number of Field Limiting Rings, FLRs, are five.

Another particular embodiment of the proposed technology provides an X-ray sensor wherein the junction termination 4 comprises at least four FLRs, a first FLR arranged at a distance $\Delta_1$ from the guard 5 selected from the interval [6 µm; 10 µm], a second FLR $7_2$ is arranged at a distance $\Delta_2$ from the first FLR Ti selected from the interval [9 µm; 13 µm], a third FLR $7_3$ is arranged at a distance $\Delta_3$ from the second FLR $7_2$ selected from the interval [12 µm; 16 µm] and a fourth FLR $7_4$ arranged at a distance $\Delta_4$ from the third FLR $7_3$ selected from the interval [15 µm; 19 µm]. FIG. 11 gives a schematic illustration of such an X-ray sensor 1. The distance $\Delta_s$ between the fourth FLR and the field stop 6 is preferably selected from the interval [20 µm; 50 µm], preferably from the interval [40 µm; 50 µm]. The distance $\Delta_g$ between the innermost FLR and the detector diodes closest thereto should, according to the proposed technology, preferably be selected from the interval [20 µm; 30 µm]. The following constraints should also be fulfilled, namely that the distance $\Delta_2$ is larger than the distance $\Delta_1$ and the distance $\Delta_3$ is larger than the distance $\Delta_2$ and the distance $\Delta_4$ is larger than the distance $\Delta_3$.

FIGS. 16a-16f provides graphs that illustrates the beneficial electric field distribution that is obtained by the proposed technology for a particular selection of distances within the mentioned intervals and a given surface charge. The vertical axis correspond to the electrical field on the surface and the horizontal axis are distance in µm.

FIG. 16a illustrates a junction termination having four FLRs arranged between the guard ring and the field stop. The distance between the guard ring and the first FLR is in this particular graph 6 µm, the distance between the first FLR and the second FLR is 9 µm, the distance between the second and the third FLR is 12 µm, the distance between the third and the fourth interval is 15 µm. These values fall within the specified intervals and yields a well-balanced peak distribution over the termination in the case of positive surface charge density of $1\times10^{11}$ cm$^{-2}$.

FIG. 16b illustrates a junction termination having four FLRs arranged between the guard ring and the field stop. The distance between the guard ring and the first FLR is in this particular graph 6 µm, the distance between the first FLR and the second FLR is 9 µm, the distance between the second and the third FLR is 12 µm, the distance between the third and the fourth interval is 15 µm. These values fall within the specified intervals and yields a well-balanced peak distribution over the termination also in the case of positive surface charge density of $5\times10^{11}$ cm$^{-2}$ FIG. 16c illustrates a junction termination having four FLRs arranged between the guard ring and the field stop. The distance between the guard ring and the first FLR is in this particular graph 8 µm, the distance between the first FLR and the second FLR is 11 µm, the distance between the second and the third FLR is 14 µm, the distance between the third and the fourth interval is 17 µm. These values fall within the specified intervals and yields a well-balanced peak distribution over the termination in the case of positive surface charge density of $1\times10^{11}$ cm$^{-2}$.

FIG. 16d illustrates a junction termination having four FLRs arranged between the guard ring and the field stop. The distance between the guard ring and the first FLR is in this particular graph 8 µm, the distance between the first FLR and the second FLR is 11 µm, the distance between the second and the third FLR is 14 µm, the distance between the third and the fourth interval is 17 µm. These values fall within the specified intervals and yields a well-balanced peak distribution over the termination also in the case of positive surface charge density of $5\times10^{11}$ cm$^{-2}$.

FIG. 16e illustrates a junction termination having four FLRs arranged between the guard ring and the field stop. The distance between the guard ring and the first FLR is in this particular graph 10 µm, the distance between the first FLR and the second FLR is 13 µm, the distance between the second and the third FLR is 16 µm, the distance between the third and the fourth interval is 19 µm. These values fall within the specified intervals and yields a well-balanced peak distribution over the termination in the case of positive surface charge density of $1\times10^{11}$ cm$^{-2}$.

FIG. 16f illustrates a junction termination having four FLRs arranged between the guard ring and the field stop. The distance between the guard ring and the first FLR is in this particular graph 10 μm, the distance between the first FLR and the second FLR is 13 μm, the distance between the second and the third FLR is 16 μm, the distance between the third and the fourth interval is 19 μm. These values fall within the specified intervals and yields a well-balanced peak distribution over the termination also in the case of positive surface charge density of $5\times10^{11}$ cm$^{-2}$.

A preferred embodiment of the X-ray sensor with four FLRs is provided by an X-ray sensor wherein the distance $\Delta_1$ is 8±0.5 μm, the distance $\Delta_2$ is 11±0.5 μm, the distance $\Delta_3$ is 14±0.5 μm and the fourth distance $\Delta_4$ is 17±0.5 μm. The following constraints should also be fulfilled, namely that the distance $\Delta_2$ is larger than the distance $\Delta_1$ and the distance $\Delta_3$ is larger than the distance $\Delta_2$ and the distance $\Delta_4$ is larger than the distance $\Delta_3$.

Another particular embodiment of the proposed technology provides an X-ray sensor wherein the junction termination 4 comprises at least five FLRs, a first FLR $7_1$ arranged at a distance $\Delta_1$ from the guard 5 selected from the interval [5 μm; 9 μm], a second FLR $7_2$ is arranged at a distance $\Delta_2$ from the first FLR $7_1$ selected from the interval [8 μm; 12 μm], a third FLR $7_3$ is arranged at a distance $\Delta_3$ from the second FLR $7_2$ selected from the interval [10.5 μm; 14.5 μm], a fourth FLR $7_4$ arranged at a distance $\Delta_4$ from the third FLR $7_3$ selected from the interval [13.5 μm; 17.5 μm], and a fifth FLR $7_5$ arranged at a distance $\Delta_5$ from the fourth FLR $7_4$ selected from the interval [16 μm; 20 μm]. FIG. 14 gives a schematic illustration of such an X-ray sensor 1. The distance $\Delta_s$ between the fifth FLR and the field stop 6 is preferably selected from the interval [20 μm; 50 μm], preferably from the interval [40 μm; 50 μm]. The distance $\Delta_g$ between the innermost FLR and the detector diodes closest thereto should, according to the proposed technology, preferably be selected from the interval [20 μm; 30 μm]. The following constraints should also be fulfilled, namely that the distance $\Delta_2$ is larger than the distance $\Delta_1$ and the distance $\Delta_3$ is larger than the distance $\Delta_2$ and the distance $\Delta_4$ is larger than the distance $\Delta_3$, and the distance $\Delta_5$ is larger than the distance $\Delta_4$.

FIGS. 17a-17f provides graphs that illustrates the beneficial electric field distribution that is obtained by the proposed technology for a particular selection of distances within the mentioned intervals and a given surface charge. The vertical axis correspond to the electrical field on the surface and the horizontal axis are distance in μm.

Figure 17A:
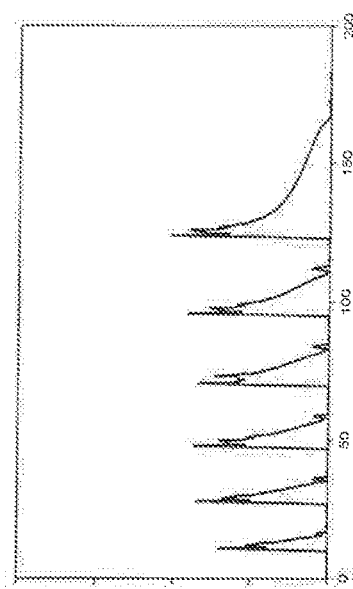
FIGS. 17a-17f are graphs illustrating the beneficial electric field distributions that are obtained by yet another particular example of the proposed technology where five FLRs are used.

FIG. 17a illustrates a junction termination having five FLRs arranged between the guard ring and the field stop. The distance between the guard ring and the first FLR is in this particular graph 5 μm, the distance between the first FLR and the second FLR is 8 μm, the distance between the second and the third FLR is 10.5 μm, the distance between the third and the fourth FLR is 13.5 μm and the distance between the fourth and fifth FLR is 16 μm. These values fall within the specified intervals and yields a well-balanced peak distribution over the termination in the case of positive surface charge density of $1\times10^{11}$ cm$^{-2}$.

Figure 17B:
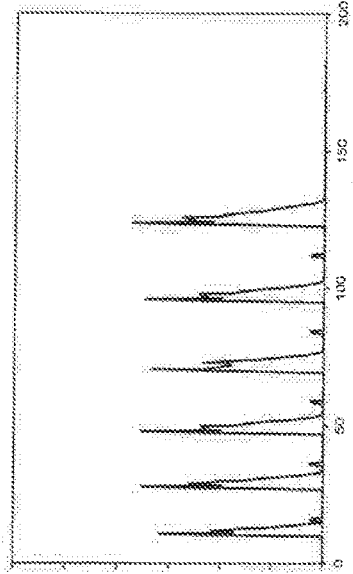

FIG. 17b illustrates a junction termination having five FLRs arranged between the guard ring and the field stop. The distance between the guard ring and the first FLR is in this particular graph 5 μm, the distance between the first FLR and the second FLR is 8 μm, the distance between the second and the third FLR is 10.5 μm, the distance between the third and the fourth FLR is 13.5 μm and the distance between the fourth and fifth FLR is 16 μm. These values fall within the specified intervals and yields a well-balanced peak distribution over the termination also in the case of positive surface charge density of $5\times10^{11}$ cm$^{-2}$.

Figure 17C:
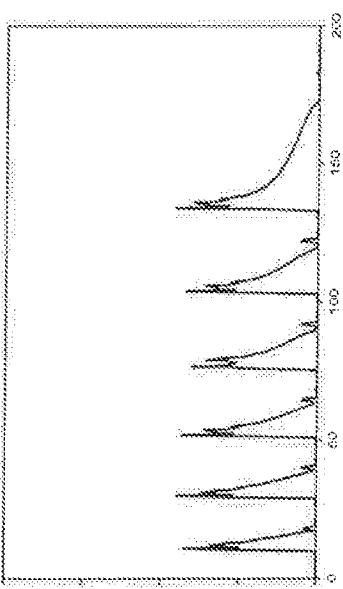

FIG. 17c illustrates a junction termination having five FLRs arranged between the guard ring and the field stop. The distance between the guard ring and the first FLR is in this particular graph 7 μm, the distance between the first FLR and the second FLR is 10 μm, the distance between the second and the third FLR is 12.5 μm, the distance between the third and the fourth FLR is 15.5 μm and the distance between the fourth and fifth FLR is 18 μm. These values fall within the specified intervals and yields a well-balanced peak distribution over the termination in the case of positive surface charge density of $1\times10^{11}$ cm$^{-2}$.

Figure 17D:
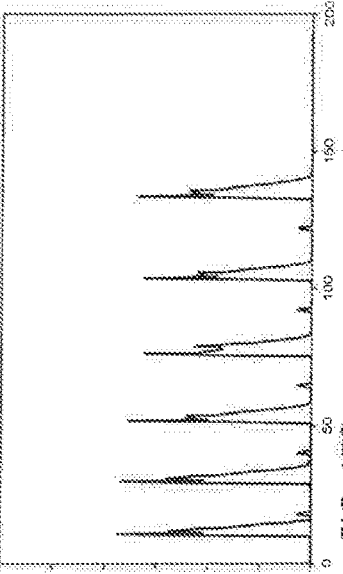

FIG. 17d illustrates a junction termination having five FLRs arranged between the guard ring and the field stop. The distance between the guard ring and the first FLR is in this particular graph 7 μm, the distance between the first FLR and the second FLR is 10 μm, the distance between the second and the third FLR is 12.5 μm, the distance between the third and the fourth FLR is 15.5 μm and the distance between the fourth and fifth FLR is 18 μm. These values fall within the specified intervals and yields a well-balanced peak distribution over the termination also in the case of positive surface charge density of $5\times10^{11}$ cm$^{-2}$.

Figure 17E:
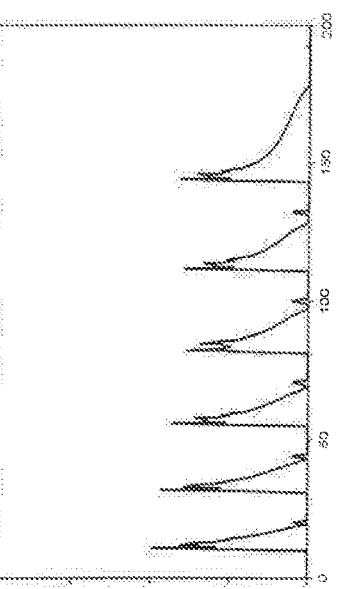

FIG. 17e illustrates a junction termination having five FLRs arranged between the guard ring and the field stop. The distance between the guard ring and the first FLR is in this particular graph 9 μm, the distance between the first FLR and the second FLR is 12 μm, the distance between the second and the third FLR is 14.5 μm, the distance between the third and the fourth FLR is 17.5 μm and the distance between the fourth and fifth FLR is 20 μm. These values fall within the specified intervals and yields a well-balanced peak distribution over the termination in the case of positive surface charge density of $1\times10^{11}$ cm$^{-2}$.

Figure 17F:
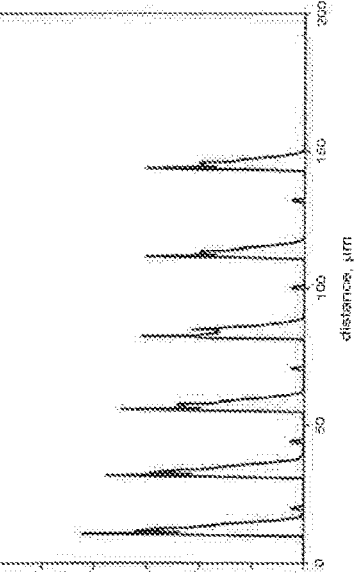

FIG. 17f illustrates a junction termination having five FLRs arranged between the guard ring and the field stop. The distance between the guard ring and the first FLR is in this particular graph 9 μm, the distance between the first FLR and the second FLR is 12 μm, the distance between the second and the third FLR is 14.5 μm, the distance between the third and the fourth FLR is 17.5 μm and the distance between the fourth and fifth FLR is 20 μm. These values fall within the specified intervals and yields a well-balanced peak distribution over the termination also in the case of positive surface charge density of $5\times10^{11}$ cm$^{-2}$.

Figure 13:
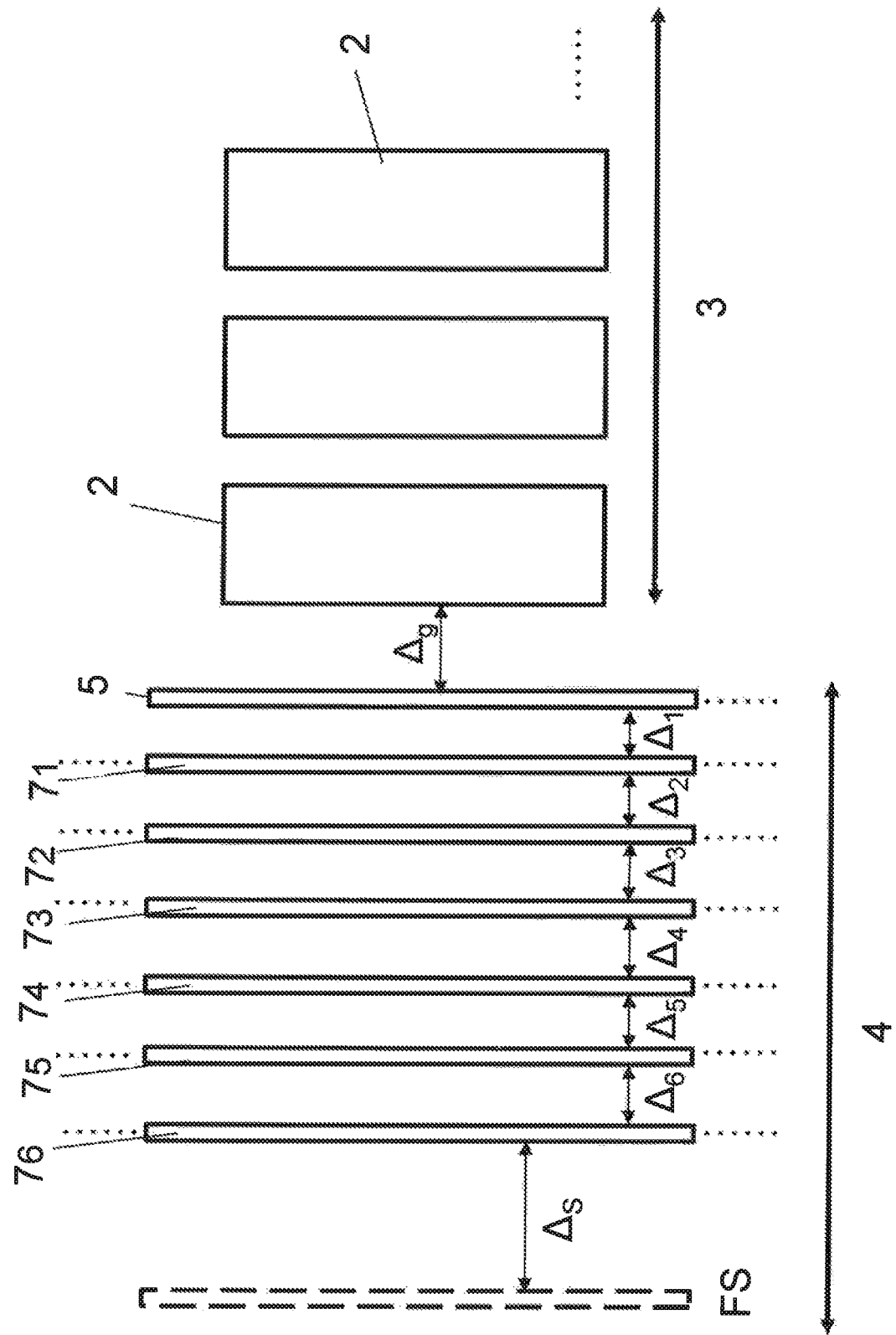
FIG. 13 is a schematic illustration of an X-ray sensor according to the proposed technology wherein the number of Field Limiting Rings, FLRs, are six.

A preferred embodiment of the X-ray sensor with five FLRs is provided by an X-ray sensor wherein the distance $\Delta_1$ is 7±0.5 μm, the distance $\Delta_2$ is 10±0.5 μm, the distance $\Delta_3$ is 12.5±0.5 μm, the distance $\Delta_4$ is 15.5±0.5 μm and the fifth distance $\Delta_5$ is 18±0.5 μm. The following constraints should also be fulfilled, namely that the distance $\Delta_2$ is larger than the distance $\Delta_1$ and the distance $\Delta_3$ is larger than the distance $\Delta_2$ and the distance $\Delta_4$ is larger than the distance $\Delta_3$, and the distance $\Delta_5$ is larger than the distance $\Delta_4$ Still another particular embodiment of the proposed technology, schematically illustrated in FIG. 13 provides an X-ray sensor 1 wherein the junction termination 4 comprises six FLRs 7, a first FLR $7_1$ arranged at a distance $\Delta_1$ from the guard 5 selected from the interval [4 μm; 8 μm], a second FLR $7_2$ arranged at a distance $\Delta_2$ from the first FLR $7_1$ from the interval [6.5 μm; 10.5 μm], a third FLR $7_3$ arranged at a distance $\Delta_3$ from the second FLR $7_2$ selected from the interval [9 μm; 13 μm], a fourth FLR $7_4$ arranged at a distance $\Delta_4$ from the third FLR $7_3$ selected from the interval [11.5 µm; 15.5 µm], a fifth FLR $7_5$ arranged at a distance $\Delta_5$ from the fourth FLR $7_4$ selected from the interval [14 µm; 18 µm] and a sixth FLR $7_6$ arranged at a distance $\Delta_6$ from the fifth FLR $7_5$ selected from the interval [17 µm; 21 µm]. The following constraints should also be fulfilled, namely that the distance $\Delta_2$ is larger than the distance $\Delta_1$ and the distance $\Delta_3$ is larger than the distance $\Delta_2$, the distance $\Delta_4$ is larger than the distance $\Delta_3$, the distance $\Delta_5$ is larger than the distance $\Delta_4$ and the distance $\Delta_6$ is larger than the distance $\Delta_5$.

FIGS. 18a-18f provides graphs that illustrates the beneficial electric field distribution that is obtained by the proposed technology for a particular selection of distances within the mentioned intervals and a given surface charge. The vertical axis correspond to the electrical field on the surface and the horizontal axis are distance in µm.

FIG. 18a illustrates a junction termination having six FLRs arranged between the guard ring and the field stop. The distance between the guard ring and the first FLR is in this particular graph 4 µm, the distance between the first FLR and the second FLR is 6.5 µm, the distance between the second and the third FLR is 9 µm, the distance between the third and the fourth FLR is 11.5 µm, the distance between the fourth and fifth FLR is 14 µm and the distance between the fifth and sixth FLR is 17 µm. These values fall within the specified intervals and yield a well-balanced peak distribution over the termination in the case of positive surface charge density of $1 \times 10^{11}$ cm$^{-2}$.

FIG. 18b illustrates a junction termination having six FLRs arranged between the guard ring and the field stop. The distance between the guard ring and the first FLR is in this particular graph 5 µm, the distance between the first FLR and the second FLR is 8 µm, the distance between the second and the third FLR is 10.5 µm, the distance between the third and the fourth FLR is 13.5 µm, the distance between the fourth and fifth FLR is 16 µm and the distance between the fifth and sixth FLR is 19 µm. These values fall within the specified intervals and yield a well-balanced peak distribution over the termination also when the positive surface charge density is $5 \times 10^{11}$ cm$^{-2}$.

FIG. 18c illustrates a junction termination having six FLRs arranged between the guard ring and the field stop. The distance between the guard ring and the first FLR is in this particular graph 6 µm, the distance between the first FLR and the second FLR is 8.5 µm, the distance between the second and the third FLR is 11 µm, the distance between the third and the fourth FLR is 13.5 µm, the distance between the fourth and fifth FLR is 16 µm and the distance between the fifth and sixth FLR is 19 µm. These values fall within the specified intervals and yield a well-balanced peak distribution over the termination in the case of positive surface charge density of $1 \times 10^{11}$ cm$^{-2}$.

FIG. 18d illustrates a junction termination having six FLRs arranged between the guard ring and the field stop. The distance between the guard ring and the first FLR is in this particular graph 6 µm, the distance between the first FLR and the second FLR is 8.5 µm, the distance between the second and the third FLR is 11 µm, the distance between the third and the fourth FLR is 13.5 µm, the distance between the fourth and fifth FLR is 16 µm and the distance between the fifth and sixth FLR is 19 µm. These values fall within the specified intervals and yield a well-balanced peak distribution over the termination also when the positive surface charge density is $5 \times 10^{11}$ cm$^{-2}$.

FIG. 18e illustrates a junction termination having six FLRs arranged between the guard ring and the field stop. The distance between the guard ring and the first FLR is in this particular graph 8 µm, the distance between the first FLR and the second FLR is 10.5 µm, the distance between the second and the third FLR is 13 µm, the distance between the third and the fourth FLR is 15.5 µm, the distance between the fourth and fifth FLR is 18 µm, and the distance between the fifth and sixth FLR is 21 µm. These values fall within the specified intervals and yield a well-balanced peak distribution over the termination in the case of positive surface charge density of $1 \times 10^{11}$ cm$^{-2}$.

FIG. 18f illustrates a junction termination having six FLRs arranged between the guard ring and the field stop. The distance between the guard ring and the first FLR is in this particular graph 8 µm, the distance between the first FLR and the second FLR is 10.5 µm, the distance between the second and the third FLR is 13 µm, the distance between the third and the fourth FLR is 15.5 µm, the distance between the fourth and fifth FLR is 18 µm and the distance between the fifth and sixth FLR is 21 µm. These values fall within the specified intervals and yield a well-balanced peak distribution over the termination also when the positive surface charge density is $5 \times 10^{11}$ cm$^{-2}$.

A particularly preferred embodiment of the X-ray sensor with six FLRs is provided by an X-ray sensor 1, wherein the distance $\Delta_1$ is 6±0.5 µm, the distance $\Delta_2$ is 8.5±0.5 µm, the distance $\Delta_3$ is 11±0.5 µm, the distance $\Delta_4$ is 13.5±0.5 µm the distance $\Delta_5$ is 16±0.5 µm and the distance $\Delta_6$ is 19±0.5 µm. The following constraints should also be fulfilled, namely that the distance $\Delta_2$ is larger than the distance $\Delta_1$ and the distance $\Delta_3$ is larger than the distance $\Delta_2$, the distance $\Delta_4$ is larger than the distance $\Delta_3$, the distance $\Delta_5$ is larger than the distance $\Delta_4$ and the distance $\Delta_6$ is larger than the distance $\Delta_5$.

A preferred embodiment of the earlier described X-ray sensor is provided by an X-ray sensor, wherein the active detector region comprises a doped material having a doping concentration in the interval $1 \times 10^{10}$/cm$^3$ to $1 \times 10^{12}$/cm$^3$.

Another preferred embodiment of the earlier described X-ray sensor is provided by an X-ray sensor, wherein the active detector region comprises a doped silicon, having the opposite type of doping as the field limiting rings.

Still another preferred embodiment of the earlier described X-ray sensor is provided by an X-ray sensor, wherein, wherein the distance between the detector diode 2 closest to the guard 5 and the guard 5 is selected to lie in the interval [20 µm; 30 µm].

According to an optional embodiment of the proposed technology is the width of the guard 5 preferably selected to lie within the interval [30 µm; 50 µm], even more preferably within the interval [40 µm; 50 µm]. These selections apply to all FLR configurations, i.e., for N=2, N=3, N=4, N=5 and N=6.

According to an optional embodiment of the proposed technology is width of a Field Limiting Ring, FLR, preferably be selected to lie within the interval [5 µm; 15 µm]. These selections apply to all FLR configurations, i.e., for N=2, N=3, N=4, N=5 and N=6.

An additional embodiment of the proposed technology provides an X-ray sensor wherein the distance between the FLR 7 closest to the field stop 6 and the field stop 6 is selected from the interval [20 µm; 50 µm], preferably from the interval [40 µm; 50 µm]. These selections apply to all FLR configurations, i.e., for N=2, N=3, N=4, N=5 and N=6.

The proposed X-ray sensor may preferably be used in an X-ray imaging system. A particular system is given by an X-ray imaging system 100 that comprises an X-ray source 10 that is configured to emit X-rays. The X-ray imaging system 100 also comprises an X-ray detector system 20 that comprises at least one X-ray sensor 1 according to the proposed technology. The X-ray imaging system 100 also comprises an image processing device 30. An embodiment of such an X-ray imaging system is illustrated schematically in FIGS. 1 and 2.

The proposed technology also provides a method for constructing an X-ray sensor according to the earlier described embodiments. In what follows we will describe the proposed method in some detail.

Figure 19:
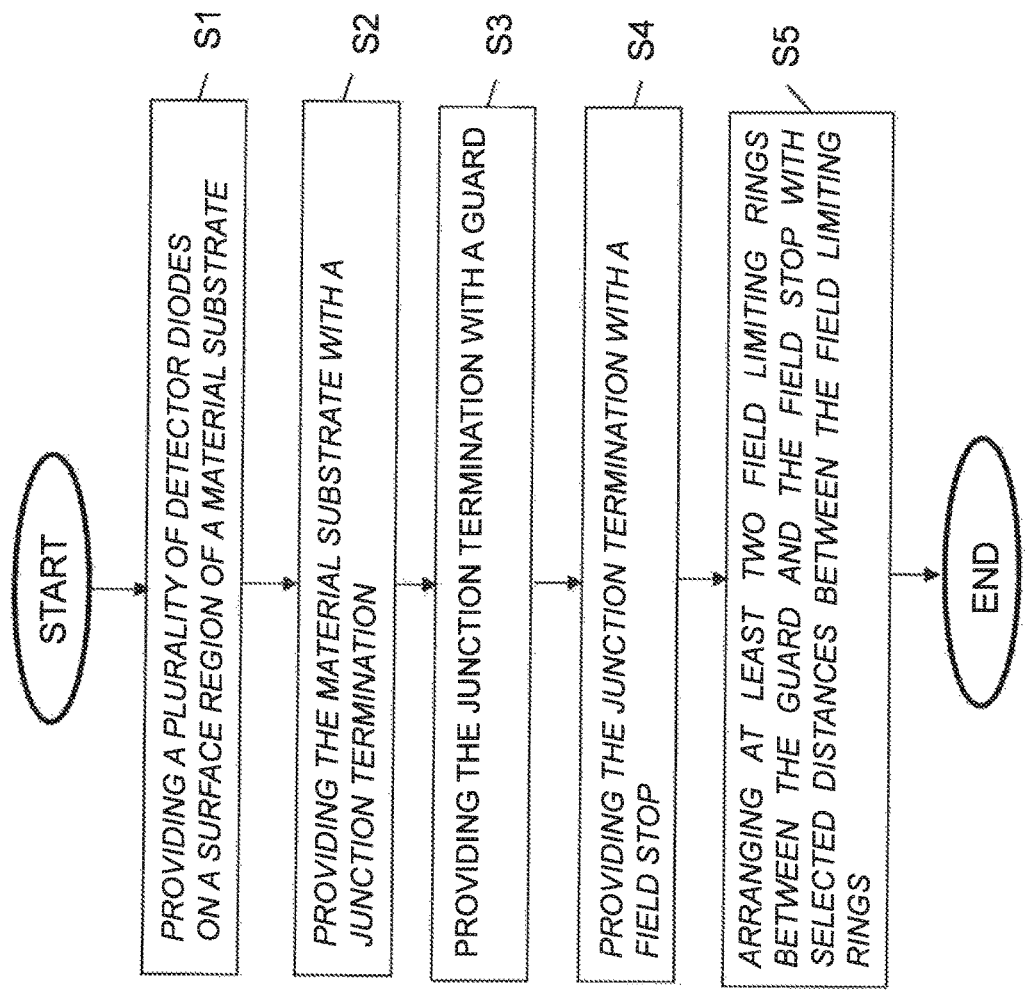
FIG. 19 is a flow diagram illustrating a method for constructing an X-ray sensor according to the proposed technology.

FIG. 19 is a schematic flow diagram illustrating an example of a method for constructing an X-ray sensor 1. The method comprises the step of providing S1 a plurality of detector diodes on a surface region of a material substrate. The method also comprises providing S2 the material substrate with a junction termination surrounding the surface region. The method also comprises to construct the junction termination by:

providing S3 a guard ring adjacent the surface region, and providing S4 a field stop outside of the guard ring, and arranging S5 at least two field limiting rings, FLRs 7 between the guard 5 and the field stop 6, where a first FLR Ti is arranged at a distance $\Delta_1$ from the guard 5 selected from the interval [4 μm; 12 μm], a second FLR $7_2$ is arranged at a distance $\Delta_2$ from the first FLR $7_1$ selected from the interval [6.5 μm; 15 μm]. According to the proposed technology the distance $\Delta_2$ is selected to be larger than the distance $\Delta_1$.

According to a particular embodiment of the proposed technology there is provided a method wherein the step S5 of arranging the at least two FLRs comprises to arrange two FLRs, wherein the first FLR Ti is arranged at a distance $\Delta_1$ given by 10±0.5 μm, and the second FLR $7_2$ is arranged at a distance $\Delta_2$ from the first FLR Ti given by 13±0.5 μm. The following constraints should also be fulfilled, namely that the distance $\Delta_2$ is larger than the distance $\Delta_1$.

According to a particular embodiment of the proposed technology there is provided a method wherein the step S5 of arranging the at least two FLRs comprises to arrange three FLRs, a first FLR $7_1$ at a distance $\Delta_1$ from the guard 5 selected from the interval [7 μm; 12 μm], arranging a second FLR $7_2$ at a distance $\Delta_2$ from the first FLR selected from the interval [10 μm; 14 μm], and arranging a third FLR $7_3$ at a distance $\Delta_3$ from the second FLR $7_2$ selected from the interval [13 μm; 17 μm]. The following constraints should also be fulfilled, namely that the distance $\Delta_2$ is larger than the distance $\Delta_1$ and the distance $\Delta_3$ is larger than the distance $\Delta_2$.

According to a particular embodiment of the proposed technology there is provided a method wherein the step S5 of arranging the at least two FLRs comprises to arrange at least three FLRs, wherein the first FLR $7_1$ is arranged at a distance $\Delta_1$ given by 9±0.5 μm, the second FLR $7_2$ is arranged at a distance $\Delta_2$ from the first FLR $7_1$ given by 12±0.5 μm, and the third FLR $7_3$ is arranged at a distance $\Delta_3$ from the second FLR $7_2$ given by 15±0.5 μm. The following constraints should also be fulfilled, namely that the distance $\Delta_2$ is larger than the distance $\Delta_1$ and the distance $\Delta_3$ is larger than the distance $\Delta_2$.

According to still another embodiment of the proposed technology there is provided a method wherein the step S5 of arranging the at least two FLRs comprises to arrange four FLRs between the guard 5 and the field stop 6, wherein a first FLR Ti is arranged at a distance $\Delta_1$ from the guard 5 selected from the interval [6 μm; 10 μm], a second FLR $7_2$ is arranged at a distance $\Delta_2$ from the first FLR $7_1$ selected from the interval [9 μm; 13 μm], a third FLR $7_3$ is arranged at a distance $\Delta_3$ from the second FLR $7_2$ selected from the interval [12 μm; 16 μm] and a fourth FLR $7_4$ is arranged at a distance $\Delta_4$ from the third FLR $7_3$ selected from the interval [15 μm; 19 μm]. The following constraints should also be fulfilled, namely that the distance $\Delta_2$ is larger than the distance $\Delta_1$ and the distance $\Delta_3$ is larger than the distance $\Delta_2$ and the distance $\Delta_4$ is larger than the distance $\Delta_3$.

According to a particular embodiment of the proposed technology there is provided a method, wherein the step S5 of arranging the at least two FLRs comprises to arrange at least four FLRs, wherein the distance $\Delta_1$ is 8±0.5 μm, the distance $\Delta_2$ is 11±0.5 μm, the distance $\Delta_3$ is 14±0.5 μm and the distance $\Delta_4$ is 17±0.5 μm. The following constraints should also be fulfilled, namely that the distance $\Delta_2$ is larger than the distance $\Delta_1$ and the distance $\Delta_3$ is larger than the distance $\Delta_2$ and the distance $\Delta_4$ is larger than the distance $\Delta_3$.

According to the proposed technology there is provided a method wherein the step S5 of arranging the at least two FLRs comprises to arrange at least five FLRs between the guard 5 and the field stop 6, wherein a first FLR $7_1$ is arranged at a distance $\Delta_1$ from the guard 5 selected from the interval [5 μm; 9 μm], the second FLR $7_2$ is arranged at a distance $\Delta_2$ from the first FLR $7_1$ selected from the interval [8 μm; 12 μm], the third FLR $7_3$ is arranged at a distance $\Delta_3$ from the second FLR $7_2$ selected from the interval [10.5 μm; 14.5 μm], the fourth FLR $7_4$ is arranged at a distance $\Delta_4$ from the third FLR $7_3$ selected from the interval [13.5 μm; 17.5 μm], and the fifth FLR $7_5$ arranged at a distance $\Delta_5$ from the fourth FLR $7_4$ selected from the interval [16 μm; 20 μm]. The following constraints should also be fulfilled, namely that the distance $\Delta_2$ is larger than the distance $\Delta_1$ and the distance $\Delta_3$ is larger than the distance $\Delta_2$, the distance $\Delta_4$ is larger than the distance $\Delta_3$ and the distance $\Delta_5$ is larger than the distance $\Delta_4$.

According to a particular embodiment of the proposed technology there is provided a method, wherein the step S5 of arranging the at least two FLRs comprises to arrange five FLRs, wherein the distance $\Delta_1$ is 7±0.5 μm, the distance $\Delta_2$ is 10±0.5, μm, the distance $\Delta_3$ is 12.5±0.5 μm, the distance $\Delta_4$ is 15.5±0.5 μm and the distance $\Delta_5$ is 18±0.5 μm. The following constraints should also be fulfilled, namely that the distance $\Delta_2$ is larger than the distance $\Delta_1$ and the distance $\Delta_3$ is larger than the distance $\Delta_2$, the distance $\Delta_4$ is larger than the distance $\Delta_3$ and the distance $\Delta_5$ is larger than the distance $\Delta_4$.

According to a particular embodiment of the proposed technology there is provided a method, wherein the step S5 of arranging the at least two FLRs comprises to arrange six FLRs between the guard 5 and the field stop 6, wherein a first FLR $7_1$ is arranged at a distance $\Delta_1$ from the guard 5 selected from the interval [4 μm; 8 μm], a second FLR $7_2$ is arranged at a distance $\Delta_2$ from the first FLR $7_1$ selected from the interval [6.5 μm; 10.5 μm], a third FLR $7_3$ is arranged at a distance $\Delta_3$ from the second FLR $7_2$ selected from the interval [9 μm; 13 μm], a fourth FLR $7_3$ is arranged at a distance $\Delta_4$ from the third FLR $7_2$ selected from the interval [11.5 μm; 15.5 μm], a fifth FLR $7_5$ is arranged at a distance $\Delta_5$ from the fourth FLR $7_4$ selected from the interval [14 μm; 18 μm] and a sixth FLR $7_6$ is arranged at a distance $\Delta_6$ from the fifth FLR $7_5$ selected from the interval [17 μm; 21 μm]. The following constraints should also be fulfilled, namely that the distance $\Delta_2$ is larger than the distance $\Delta_1$ and the distance $\Delta_3$ is larger than the distance $\Delta_2$, the distance $\Delta_4$ is larger than the distance $\Delta_3$, the distance $\Delta_5$ is larger than the distance $\Delta_4$ and the distance $\Delta_6$ is larger than the distance $\Delta_5$.

According to a particular embodiment of the proposed technology there is provided a method, wherein the step S5 of arranging the at least two FLRs comprises to arrange six FLRs, wherein the distance $\Delta_1$ is 6±0.5 μm, the distance $\Delta_2$ is 8.5±0.5, μm the distance $\Delta_3$ is 11±0.5 μm, the distance $\Delta_4$ is 13.5±0.5 µm, the distance $\Delta_5$ is 16±0.5 µm and the distance $\Delta_6$ is 19±0.5 µm. The following constraints should also be fulfilled, namely that the distance $\Delta_2$ is larger than the distance $\Delta_1$ and the distance $\Delta_3$ is larger than the distance $\Delta_2$, the distance $\Delta_4$ is larger than the distance $\Delta_3$, the distance $\Delta_5$ is larger than the distance $\Delta_4$ and the distance $\Delta_6$ is larger than the distance $\Delta_5$.

According to a particular embodiment of the proposed technology there is provided a method according to any of the described embodiments above, wherein the step S1 of providing a plurality of detector diodes on a surface region of a material substrate comprises to provide plurality of detector diodes on a surface region of the substrate that comprises a doped material having a doping concentration in the interval $1 \times 10^{10}$ cm$^{-3}$ to $1 \times 10^{12}$ cm$^{-3}$.

According to a particular embodiment of the proposed technology there is provided a method wherein the surface region comprises a doped silicon, having the opposite type of doping as the field limiting rings.

According to yet another embodiment of the proposed technology there is provided a method wherein the step S3 of providing a guard 5 adjacent the surface region comprises to arrange the guard at a distance selected from the interval [20 µm; 30 µm] from the detector diode 2 that is closest to the guard 5.

An additional embodiment of the proposed technology provides a method wherein the step S5 of arranging at least two field limiting rings, FLRs 7 between the guard 5 and the field stop 6, comprises to arrange the FLR 7 that is closest to the field stop 6 at a distance selected from the interval [20 µm; 50 µm], preferably from the interval [40 µm; 50 µm], from the field stop 6.

The invention claimed is:

1. An X-ray sensor having an active detector region comprising a plurality of detector diodes arranged on a surface region of the X-ray sensor, said X-ray sensor further comprising a junction termination surrounding said surface region comprising said plurality of detector diodes, said junction termination comprising a guard arranged closest to the end of said surface region, a field stop arranged outside said guard and at least two field limiting rings, FLRs arranged between said guard and said field stop, wherein a first FLR is arranged at a distance $\Delta_1$ from the guard selected from the interval [4 µm; 12 µm], and a second FLR is arranged at a distance $\Delta_2$ from the first FLR selected from the interval [6.5 µm; 15 µm] and wherein the distance $\Delta_2$ is larger than the distance $\Delta_1$.

2. The x-ray sensor according to claim 1, wherein said distance $\Delta_1$ is 10±0.5 µm, said distance $\Delta_2$ is 13±0.5 µm.

3. The x-ray sensor according to claim 1, wherein said junction termination comprises at least three FLRs, a first FLR arranged at a distance $\Delta_1$ from the guard selected from the interval [7 µm; 11 µm], a second FLR is arranged at a distance $\Delta_2$ from the first FLR selected from the interval [10 µm; 14 µm], and a third FLR that is arranged at a distance $\Delta_3$ from the second FLR selected from the interval [13 µm; 17 µm], and wherein the distance $\Delta_3$ is larger than the distance $\Delta_2$.

4. The x-ray sensor according to claim 3, wherein said distance $\Delta_1$ is 9±0.5 µm, said distance $\Delta_2$ is 12±0.5 µm, and said distance $\Delta_3$ is 15±0.5 µm.

5. The x-ray sensor according to claim 1, wherein said junction termination comprises at least four FLRs, a first FLR arranged at a distance $\Delta_1$ from the guard selected from the interval [6 µm; 10 µm], a second FLR is arranged at a distance $\Delta_2$ from the first FLR selected from the interval [9 µm; 13 µm], a third FLR is arranged at a distance $\Delta_3$ from the second FLR selected from the interval [12 µm; 16 µm] and a fourth FLR arranged at a distance $\Delta_4$ from the third FLR selected from the interval [15 µm; 19 µm], and wherein the distance $\Delta_2$ is larger than the distance $\Delta_1$, the distance $\Delta_3$ is larger than the distance $\Delta_2$, and the distance $\Delta_4$ is larger than the distance $\Delta_3$.

6. The x-ray sensor according to claim 5, wherein said distance $\Delta_1$ is 8±0.5 µm, said distance $\Delta_2$ is 11±0.5 µm, said distance $\Delta_3$ is 14±0.5 µm and said fourth distance $\Delta_4$ is 17±0.5 µm.

7. The X-ray sensor according to claim 1, wherein the junction termination comprises at least five FLRs, a first FLR arranged at a distance $\Delta_1$ from the guard selected from the interval [5 µm; 9 µm], a second FLR arranged at a distance $\Delta_2$ from the first FLR selected from the interval [8 µm; 12 µm], a third FLR arranged at a distance $\Delta_3$ from the second FLR selected from the interval [10.5 µm; 14.5 µm], a fourth FLR arranged at a distance $\Delta_4$ from the third FLR selected from the interval [13.5 µm; 17.5 µm], and a fifth FLR arranged at a distance $\Delta 5$ from the fourth FLR selected from the interval [16 µm; 20 µm], and wherein the distance $\Delta_2$ is larger than the distance $\Delta_1$, the distance $\Delta_3$ is larger than the distance $\Delta_2$, the distance $\Delta_4$ is larger than the distance $\Delta_3$ and the distance $\Delta_5$ is larger than the distance $\Delta_4$.

8. The x-ray sensor according to claim 7, wherein said distance $\Delta_1$ is 7±0.5 µm, said distance $\Delta_2$ is 10±0.5 µm, said distance $\Delta_3$ is 12.5±0.5 µm, said fourth distance $\Delta_4$ is 15.5±0.5 µm and said distance $\Delta_5$ is 18±0.5.

9. The X-ray sensor according to claim 1, wherein said junction termination comprises six FLRs, a first FLR arranged at a distance $\Delta_1$ from the guard selected from the interval [4 µm; 8 µm], a second FLR arranged at a distance $\Delta_2$ from the first FLR from the interval [6.5 µm; 10.5 µm], a third FLR arranged at a distance $\Delta_3$ from the second FLR selected from the interval [9 µm; 13 µm], a fourth FLR arranged at a distance $\Delta_4$ from the third FLR selected from the interval [11.5 µm; 15.5 µm], a fifth FLR arranged at a distance $\Delta_5$ from the fourth FLR selected from the interval [14 µm; 18 µm] and a sixth FLR arranged at a distance $\Delta_6$ from the fifth FLR selected from the interval [17 µm; 21 µm] and wherein the distance $\Delta_2$ is larger than the distance $\Delta_1$, the distance $\Delta_3$ is larger than the distance $\Delta_2$, the distance $\Delta_4$ is larger than the distance $\Delta_3$, the distance $\Delta_5$ is larger than the distance $\Delta_4$ and the distance $\Delta_6$ is larger than the distance $\Delta_5$.

10. The X-ray sensor according to claim 9, wherein said distance $\Delta_1$ is 6±0.5 said distance $\Delta_2$ is 8.5±0.5 said distance $\Delta_3$ is 11±0.5 said distance $\Delta_4$ is 13.5±0.5 µm said distance $\Delta_5$ is 16±0.5 µm and said distance $\Delta_6$ is 19±0.5 µm.

11. The X-ray sensor according to claim 1, wherein the active detector region comprises a doped material having a doping concentration in the interval $1 \times 10^{10}$ cm$^{-3}$ to $1 \times 10^{12}$ cm$^{-3}$.

12. The X-ray sensor according to claim 1, wherein the active detector region comprises a doped silicon, having the opposite type of doping as the field limiting rings.

13. The X-ray sensor according to claim 1, wherein the distance between the detector diode closest to the guard and the guard is selected to lie in the interval [20 µm; 30 µm].

14. The X-ray sensor according to claim 1, wherein the distance between the FLR closest to the field stop and the field stop is selected from the interval [20 µm; 50 µm].

15. An X-ray imaging system comprising:
    an X-ray source configured to emit X-rays;
    an X-ray detector system comprising at least one X-ray sensor according to claim 1; and
    an image processing device.

16. A method for constructing an X-ray sensor, said method comprises the steps of:
   providing a plurality of detector diodes on a surface region of a material substrate;
   providing said material substrate with a junction termination surrounding said surface region; wherein said junction termination is constructed by:
   providing a guard adjacent said surface region;
   providing a field stop outside of said guard;
   arranging at least two field limiting rings, FLRs between said guard and said field stop, where a first FLR is arranged at a distance $\Delta_1$ from the guard selected from the interval [4 µm; 12 µm], a second FLR is arranged at a distance $\Delta_2$ from the first FLR selected from the interval [6.5 µm; 15 µm], wherein the distance $\Delta_2$ is larger than the distance $\Delta_1$.

17. A method according to claim 16, wherein the step of arranging said at least two FLRs further comprises to arrange said first FLR at a distance $\Delta_1$ given by 10±0.5 µm, and arranging said second FLR at a distance $\Delta_2$ from the first FLR given by 13±0.5 µm.

18. A method according to claim 16, wherein the step of arranging said at least two FLRs comprises to arrange at least three FLRs, a first FLR at a distance $\Delta_1$ from the guard selected from the interval [7 µm; 11 µm], a second FLR at a distance $\Delta_2$ from the first FLR selected from the interval [10 µm; 14 µm], and a third FLR at a distance $\Delta_3$ from the second FLR selected from the interval [13 µm; 17 µm], wherein the distance $\Delta_3$ is larger than the distance $\Delta_2$.

19. A method according to claim 18, wherein the step of arranging said at least three FLRs further comprises to arrange said first FLR at a distance $\Delta_1$ given by 9±0.5 µm, arranging said second FLR at a distance $\Delta_2$ from the first FLR given by 12±0.5 µm, and arranging said third FLR at a distance $\Delta_3$ from the second FLR given by 15±0.5 µm.

20. A method according to claim 16, wherein the step of arranging said at least two FLRs comprises to arrange at least four FLRs between said guard and said field stop, a first FLR at a distance $\Delta_1$ from the guard selected from the interval [6 µm; 10 µm], a second FLR at a distance $\Delta_2$ from the first FLR selected from the interval [9 µm; 13 µm], a third FLR at a distance $\Delta_3$ from the second FLR selected from the interval [12 µm; 16 µm] and a fourth FLR at a distance $\Delta_4$ from the third FLR selected from the interval [15 µm; 19 µm], wherein the distance $\Delta_2$ is larger than the distance $\Delta_1$, the distance $\Delta_3$ is larger than the distance $\Delta_2$ and the distance $\Delta_4$ is larger than the distance $\Delta_3$.

* * * * *